US009121692B2

(12) United States Patent
Kahle et al.

(10) Patent No.: US 9,121,692 B2
(45) Date of Patent: Sep. 1, 2015

(54) METHOD AND APPARATUS FOR PROJECTION OF BIM INFORMATION

(71) Applicant: Trimble Navigation Limited, Sunnyvale, CA (US)

(72) Inventors: Kent Wayne Kahle, Hayward, CA (US); Jinwei Jiang, Dayton, OH (US); Christian Graesser, Vallentuna (SE); Andreas Winter, Feldkirch (AT); Ulrich Vollath, Westminster, CO (US)

(73) Assignee: Trimble Navigation Limited, Sunnyvale, CA (US)

( * ) Notice: Subject to any disclaimer, the term of this patent is extended or adjusted under 35 U.S.C. 154(b) by 232 days.

(21) Appl. No.: 13/800,828

(22) Filed: Mar. 13, 2013

(65) Prior Publication Data

US 2014/0268064 A1  Sep. 18, 2014

(51) Int. Cl.
*G03B 21/14* (2006.01)
*G01B 11/14* (2006.01)
*B25H 7/00* (2006.01)
*G01C 15/02* (2006.01)
*G06F 17/50* (2006.01)
*G03B 21/00* (2006.01)
*G01S 17/87* (2006.01)
*G01S 5/16* (2006.01)
*G03B 17/54* (2006.01)
*G03B 21/53* (2006.01)

(52) U.S. Cl.
CPC *G01B 11/14* (2013.01); *B25H 7/00* (2013.01); *G01C 15/02* (2013.01); *G01S 5/163* (2013.01); *G01S 17/875* (2013.01); *G03B 17/54* (2013.01); *G03B 21/00* (2013.01); *G03B 21/53* (2013.01); *G06F 17/5004* (2013.01)

(58) Field of Classification Search
CPC ........ G03B 21/00; G03B 21/14; G03B 21/28; H04N 9/3194; H04N 9/3197
USPC .................. 353/69, 119, 122; 352/36, 53, 69, 352/82–83, 85, 197, 243; 348/36, 39, 69, 348/743–747
See application file for complete search history.

(56) References Cited

U.S. PATENT DOCUMENTS

| | | | | |
|---|---|---|---|---|
| 5,117,221 | A | * | 5/1992 | Mishica, Jr. ................... 340/556 |
| 5,433,670 | A | * | 7/1995 | Trumbull ......................... 472/60 |

(Continued)

FOREIGN PATENT DOCUMENTS

| | | |
|---|---|---|
| WO | 2005025199 A2 | 3/2005 |
| WO | 2011121256 A1 | 10/2011 |

OTHER PUBLICATIONS

"PCT/US2014/025058 International Search Report and Written Opinion", Jul. 3, 2014, 9 Pages.

*Primary Examiner* — Sultan Chowdhury

(57) ABSTRACT

A system for projecting an image, including layout information, on a surface in a building under construction has a projector mounted on a moveable support for supporting a worker at a work position in the building. The projector projects an image on a surface above the moveable support in response to an image signal defining the image to be projected. The image indicates the location of connectors, anchors, and holes to be affixed to, or cut through, the surface. A system determines the two dimensional position of the projector in the building, and a distance measuring system for determines the distance from the projector to said surface. A processor, responsive to a memory having stored building plan images, provides an image signal to the projector adjusted for the two dimensional location of the projector and for the distance from the projector to the surface.

16 Claims, 25 Drawing Sheets

(56) References Cited

U.S. PATENT DOCUMENTS

| | | | |
|---|---|---|---|
| 5,601,353 A * | 2/1997 | Naimark et al. | 353/122 |
| 6,644,816 B1 * | 11/2003 | Perra et al. | 353/119 |
| 7,213,926 B2 | 5/2007 | May et al. | |
| 7,306,339 B2 | 12/2007 | Kaufman et al. | |
| 2006/0103811 A1 | 5/2006 | May et al. | |
| 2006/0170870 A1 | 8/2006 | Kaufman et al. | |

* cited by examiner

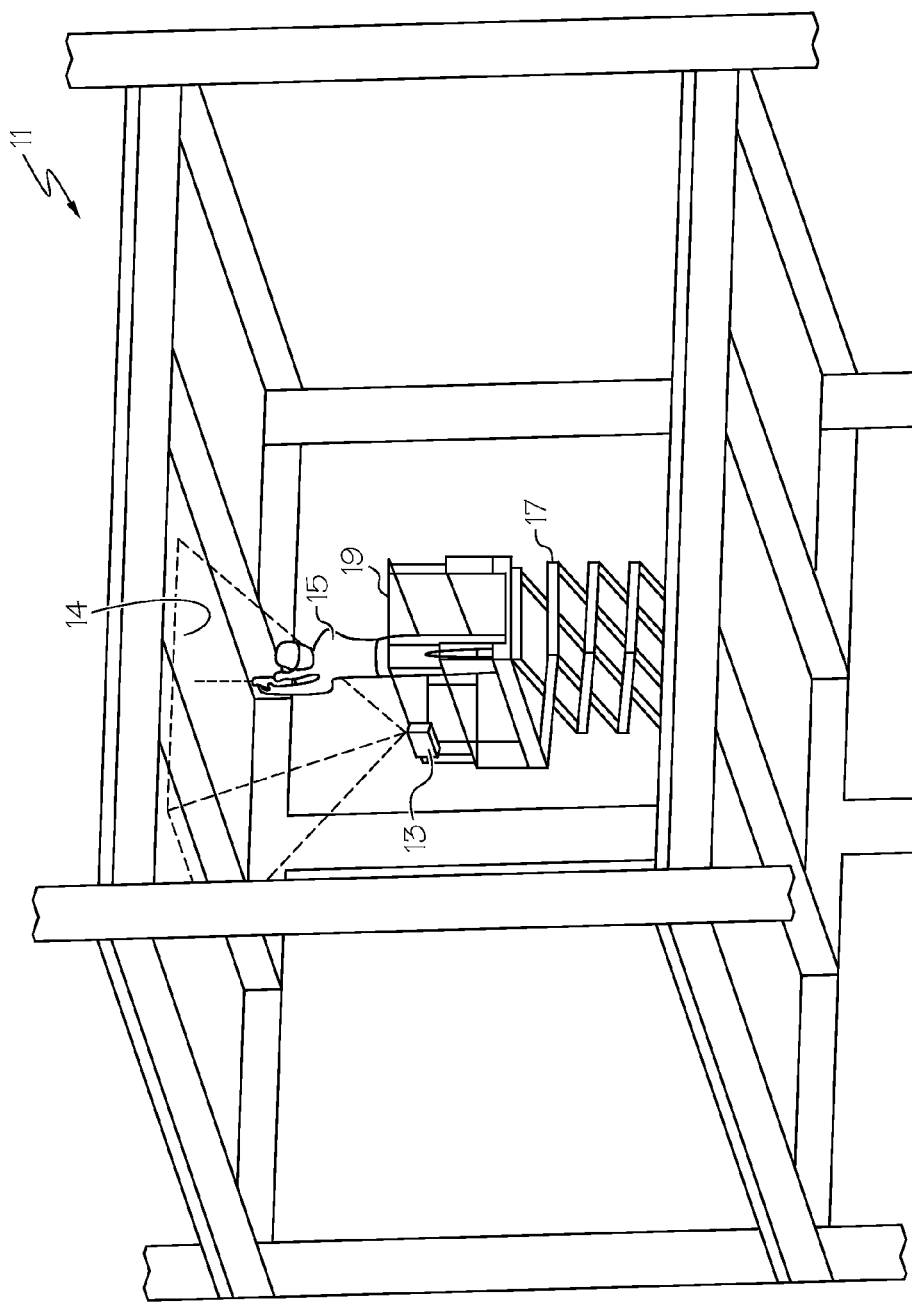

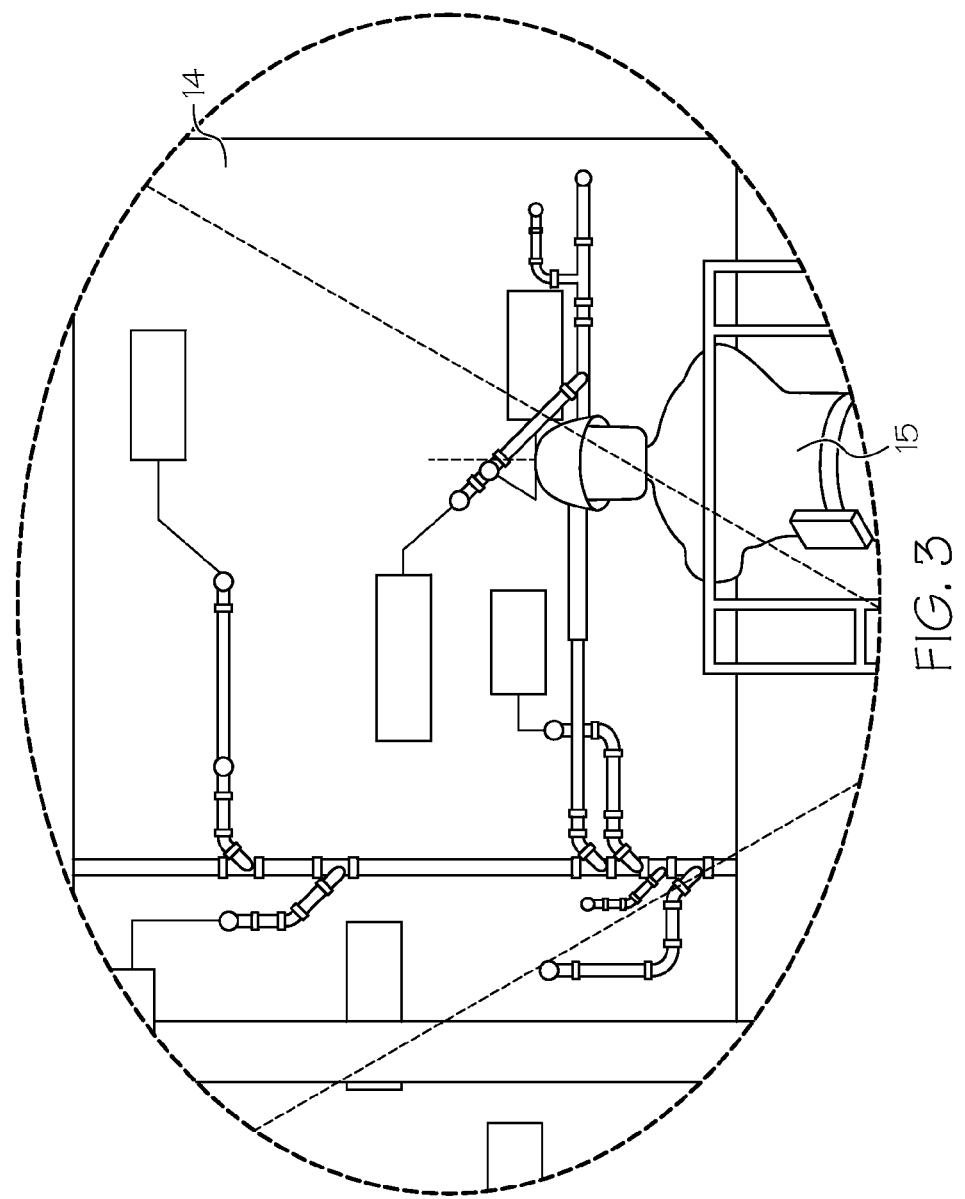

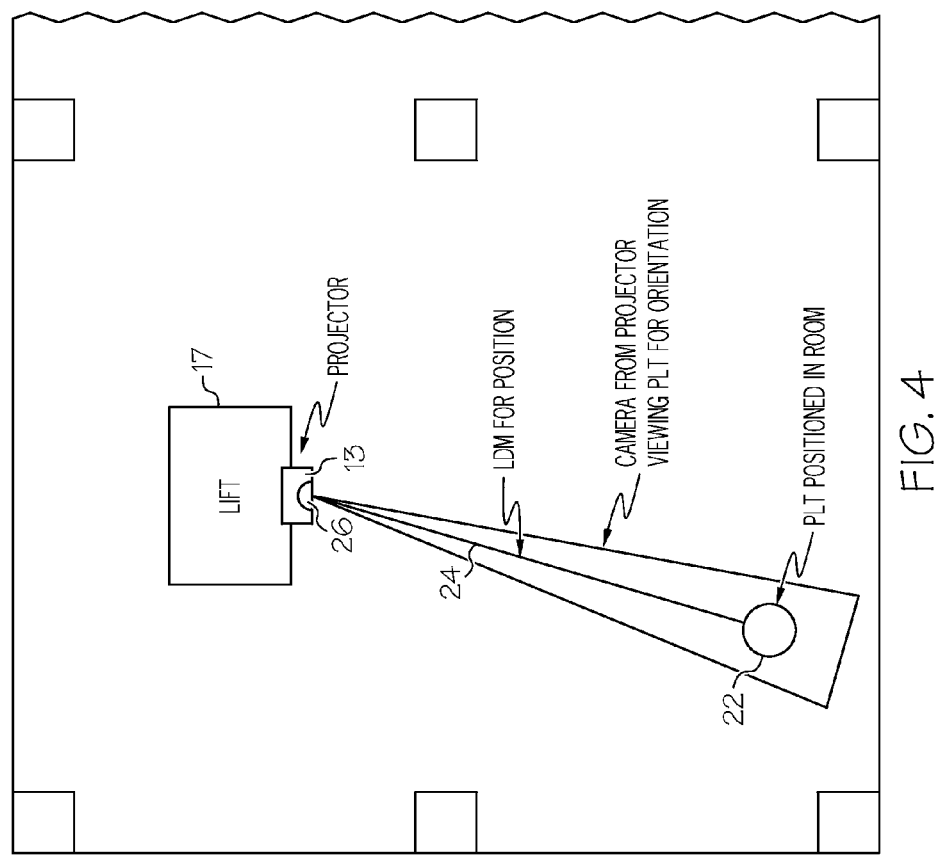

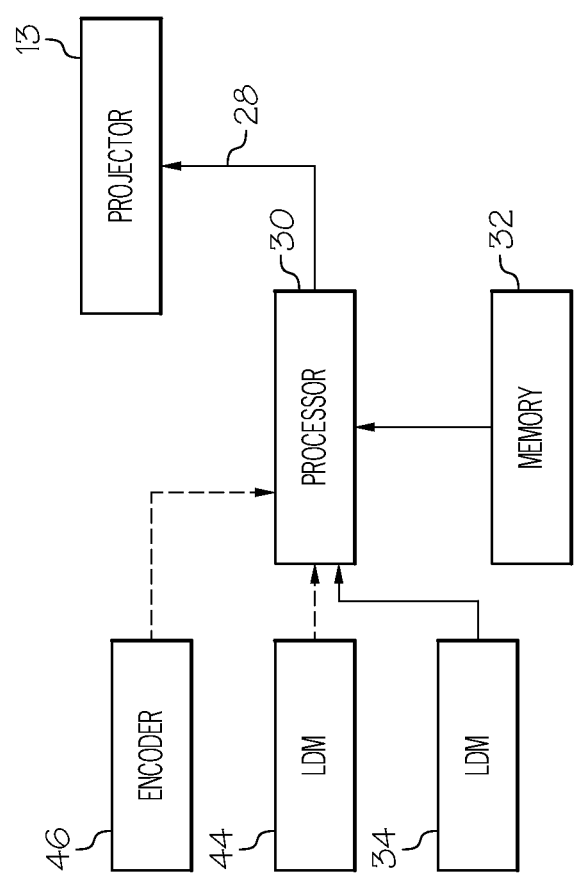

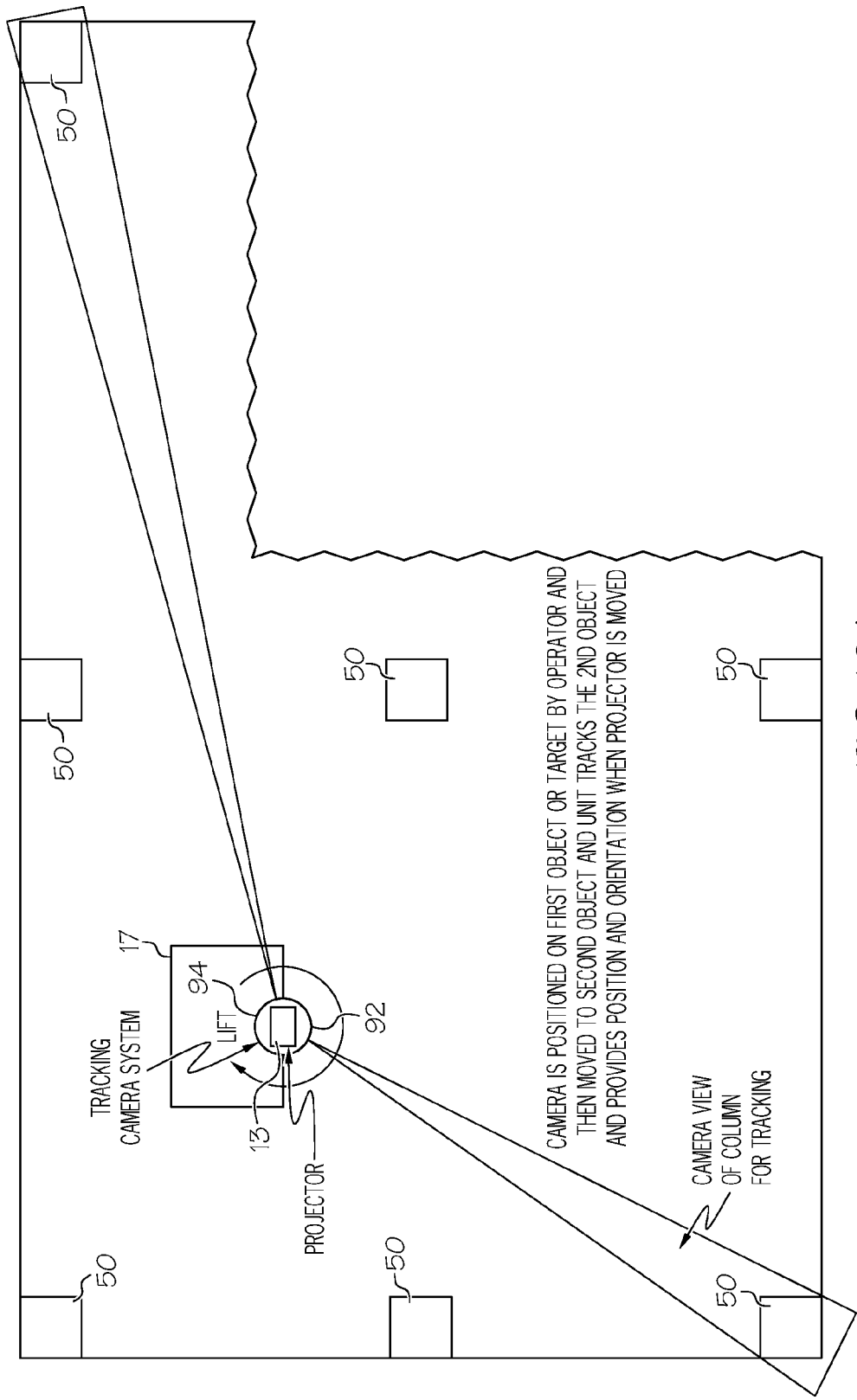

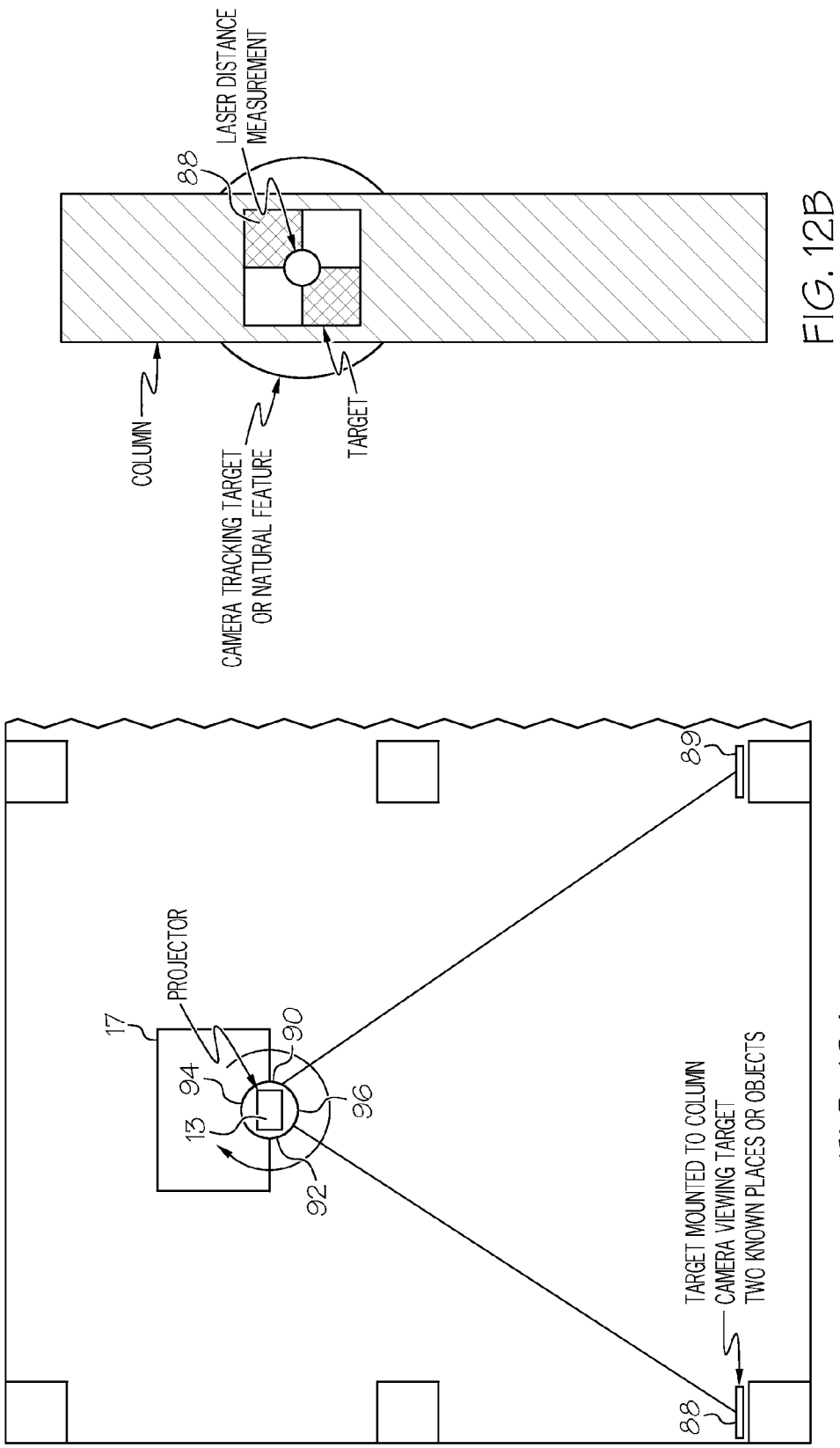

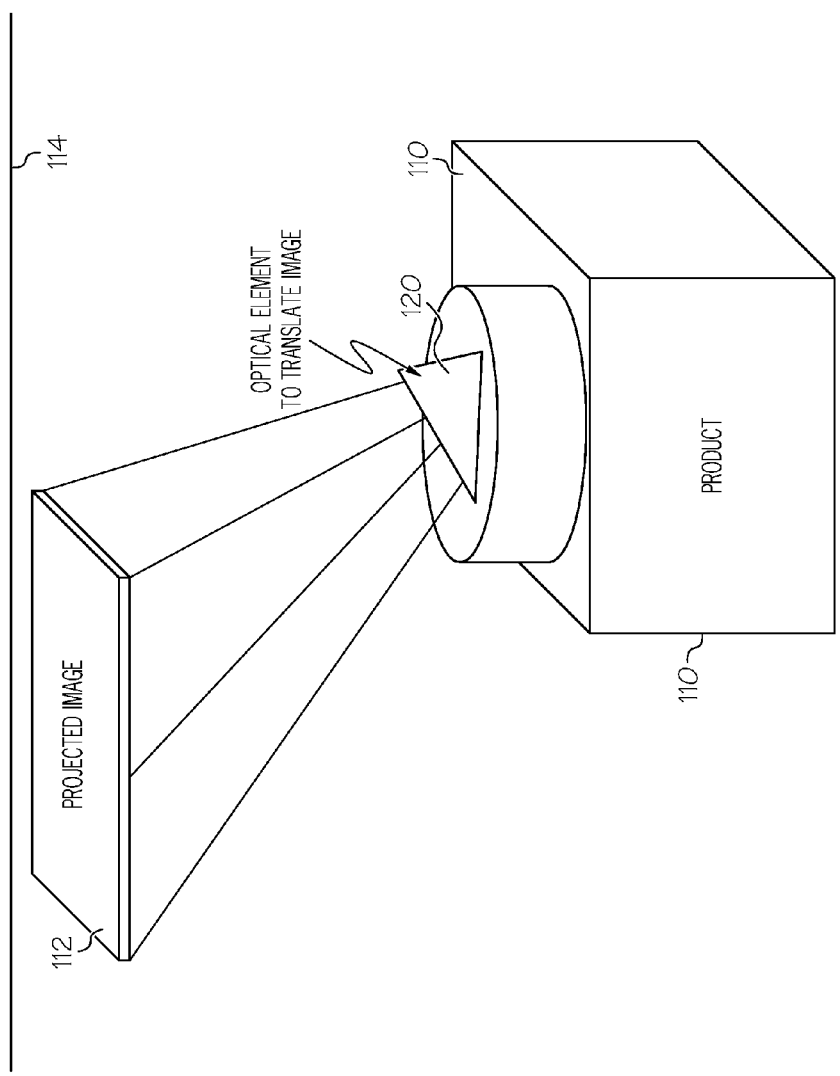

METHOD AND APPARATUS FOR PROJECTION OF BIM INFORMATION

CROSS-REFERENCE TO RELATED APPLICATIONS

None.

STATEMENT REGARDING FEDERALLY SPONSORED RESEARCH OR DEVELOPMENT

Not Applicable.

BACKGROUND

During building construction projects, such as the interior construction phase of a large new building under construction, or during renovation of an older building, it is useful to refer to Building Information Modeling (BIM) data. This data, when available, defines the building structure, including the interior, in three dimensions, and its use increases the productivity of construction workers by facilitating the location and placement of various building construction elements and fixtures. Typically, the BIM model of the building is maintained after the building construction is completed, and can be used over the life of the building for renovation, expansion, and maintenance purposes. The BIM model defines building geometry, spatial relationships, and quantities and properties of building components.

It is extremely useful to be able to locate quickly various construction points within the building interior. As the interior of a building is being finished, connectors, anchors and the like are attached to ceilings on each floor, and cuts are made and holes drilled in the ceilings using power saws and drills. All of this must be accomplished at predetermined, precisely defined positions in the building ceilings. For example, nail guns, power saws, powder anchor tools, and the like may be used to nail, cut, install fasteners, and perform other operations at predetermined points within the building with little error. Additionally, a large number of electrical, plumbing, and HVAC components must be properly sited and installed. The construction points for all of these building elements must be located with some precision. Typically, work on the ceilings of buildings is performed by a worker on a scissor lift device having an operator support platform and a powered scissor mechanism that raises and lowers the platform. The scissor lift device may be powered and drivable by a worker on the platform such that it can be moved about the building without the platform being lowered. Typically, a substantial amount of time and effort has been required to lay out the many construction points on the building ceiling. Teams of workers have been needed to measure and mark predetermined locations. Performing this task has been tedious and subject to errors, resulting both from measurement mistakes and from accumulated errors. Further, the cost of the layout process, and the time needed to perform the layout process have both been significant.

Layout of the construction points at a building interior construction site has been accomplished in more automated ways, such as for example by using a robotic total station device. The total station is positioned at a fixed, known location and directs a beam of laser light to a desired location. The beam may illuminate a floor, ceiling or wall at a point or may be directed to, and reflected from a target, such as a retroreflective target. By measuring the time of travel of the beam from the total station to the surface or target and then back to the total station, the distance to the target is determined. The direction of the beam to the target is also known. Since the position of the total station is known, the position of the target can easily be determined. It is desirable, however, to be able to layout a number of construction points on a building ceiling and to be able to do so for a worker on a scissor lift or similar device.

SUMMARY

A system for projecting an image including layout information on a surface in a building under construction includes a moveable support for supporting a worker at a work position in a building under construction, and a projector, mounted on the moveable support, for projecting an image on a surface above the moveable support. The image is projected in response to an image signal defining the image to be projected, and the image indicates the location of connectors, anchors, and holes to be affixed to or cut through the surface. A system determines the two dimensional position of the projector in the building. A distance measuring system for determines the distance from the projector to the surface. A memory stores the building plan images for the building. A processor is responsive to the memory, to the distance measuring system, and to the system, for determining the two dimensional position of the projector, for providing an image signal to the projector adjusted for the two dimensional location of the projector and for the distance from the projector to the surface.

The distance measuring system may include an electronic distance measuring system. The system for determining the two dimensional position of the projector in the building may comprises plurality of target reflectors positioned at known locations about the building and a laser projector on the moveable support for directing the laser beam at the target reflectors. The system for determining the two dimensional position of the projector in the building may comprise a video camera on the moveable support for observing the building interior and providing an indication of the location of the projector to the processor. The system for determining the two dimensional position of the projector in the building may comprise a laser distance measuring system at a known position in the building. The laser distance measuring system projects a rotating beam of laser light which sweeps across the moveable support and determines the distance and heading of the moveable support from the known position.

The building may have a plurality of recognizable features at known locations. The system for determining the two dimensional position of the projector in the building may comprise a laser distance measuring system on the moveable support that projecting a rotating beam of laser light. The rotating beam of laser light sweeps across the features at known positions in the building. This permits the distance and heading of these features from the moveable support to be determined. The system for determining the two dimensional position of the projector in the building may comprise a rotating video camera on the moveable support for taking video images of the building interior from the moveable support and determining the position of the projector based on the noted directions of the features in the video images. The rotating video camera on the moveable support takes a plurality of still video images of the building interior from the moveable support with the video camera facing in known directions for each such still video image. Alternatively, the rotating video camera on the moveable support may take a continuous moving video image of the building interior from the moveable support with the video camera facing in known directions. The system for determining the two dimensional position of the projector in the building may comprise a laser distance measuring device and transmitter for directing a laser beam at a pair of targets positioned on pillars at known locations in the building. The system for determining the two dimensional position of the projector in the building may comprise a tracking camera mounted on the moveable support, and a rotation system for rotating the camera, keeping track of the direction in which the camera faces as the camera keeps a predetermined building feature in view. The system for determining the two dimensional position of the projector in the building may comprise a tracking camera mounted on the moveable support, and a rotation system for rotating the camera, keeping track of the direction in which the camera faces as the camera keeps a predetermined building feature in view. The system further includes a laser distance measuring device and transmitter for directing a laser beam at a pair of targets positioned on pillars in the building at known locations.

A method for projecting an image including layout information on a surface in a building under construction, comprises the steps of providing a moveable support for supporting a worker at a work position, providing a projector on the moveable support, determining the distance from the projector to the surface, and projecting an image from the projector onto the ceiling above the worker. The worker may operate various tools at locations defined by the image. The method may further including the step of determining the position of the moveable support in the building such that an appropriate image for the position is projected onto the ceiling and the layout information is properly located. The step of determining the distance from the projector to the surface may include the step of using a laser distance measuring device to determine the distance from the projector to the surface.

BRIEF DESCRIPTION OF THE DRAWINGS

FIG. 2 is an enlarged view of a worker on a scissor lift performing construction operations on the ceiling of a building, similar to FIG. 1;

FIG. 3 is an enlarged view of an image including layout information being projected onto the building ceiling, similar to FIG. 1;

FIG. 4 is a simplified diagrammatic plan view of a scissor lift and a building floor, illustrating an embodiment in which the projector is located by a portable layout tool located at a known position (PLT), and a video camera on the lift;

FIG. 5A is a schematic block diagram of the system used to provide a video signal to the projector in FIG. 5 on the scissor lift;

FIG. 10A is a simplified diagrammatic plan view of a lift and building floor, illustrating an embodiment in which the projector is located by a video camera and an angle encoder on the lift, tracking building features, such as columns, that act as targets at known locations;

FIG. 12A is a simplified diagrammatic plan view of a lift and building floor, illustrating an embodiment in which the projector is located by a laser distance measuring device, a pair of video cameras, and an angle encoder on the lift, with both video cameras and the laser distance measuring device tracking targets at known locations;

FIG. 12B is a simplified diagrammatic view of a portion of a building column, illustrating the target for the embodiment of FIG. 12A;

FIG. 15 is a diagrammatic view of a projector with an optical element shifting the projected image.

DETAILED DESCRIPTION

Figure 1:
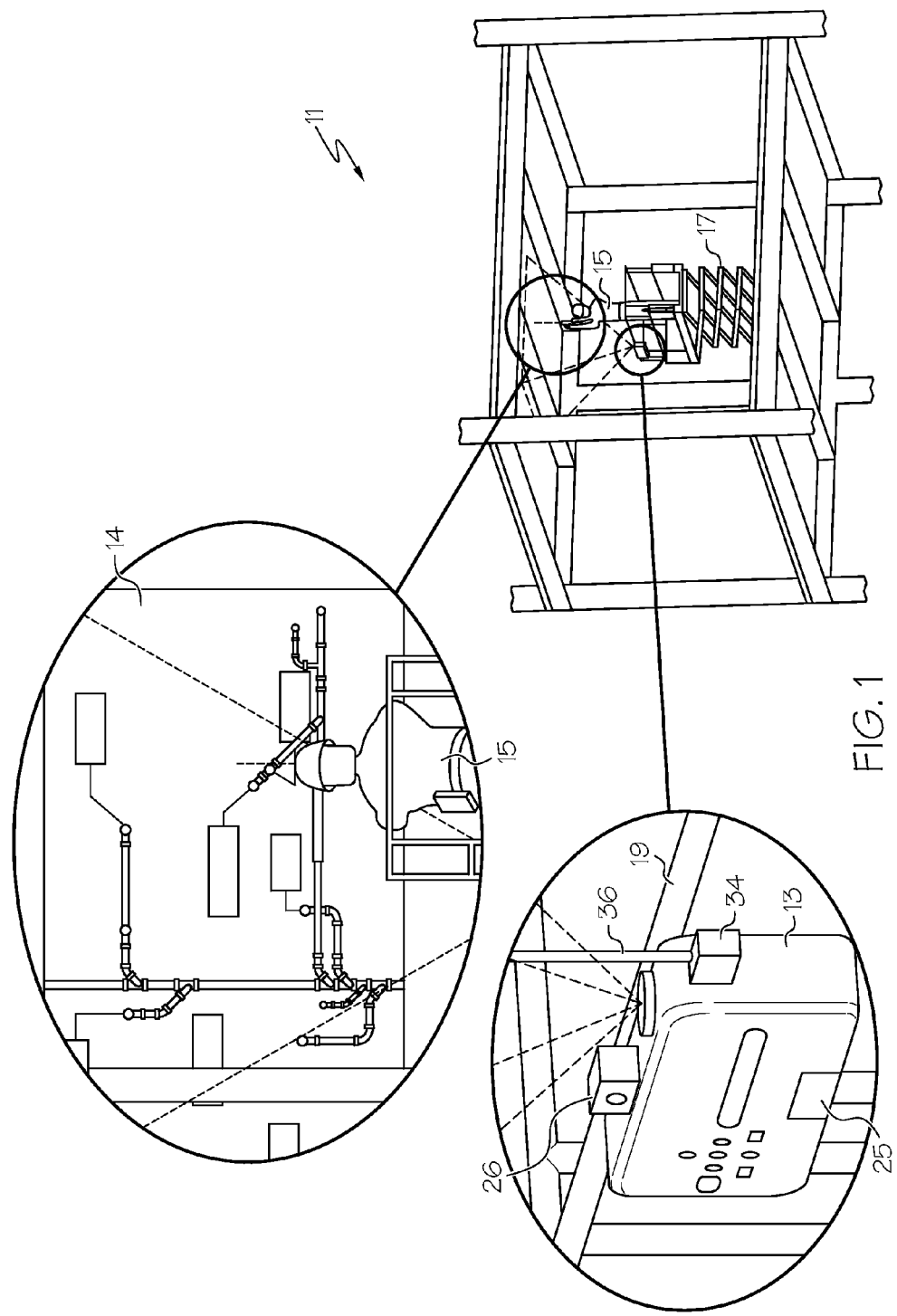
FIG. 1 is a simplified perspective view of a worker on a scissor lift, performing construction operations on the ceiling of a building, with an image including layout information being projected onto the building ceiling above the worker, and with enlarged views of a projector attached to the scissor lift and of the image projected on the ceiling.

FIGS. 1-3 illustrate a building 11 under construction, and are helpful in explaining the various embodiments of the invention. Each floor of the building 11 is an interior construction site in which various building structures, components, and fixtures must be positioned. In laying out the interior of each floor, it is necessary to locate a large number of construction points where various operations are performed or building components are to be located and installed. Power tools and hand tools are used to install fasteners, nails, and similar devices, and to cut and drill various structural components, such as the ceiling and walls of each level of the building. These operations are performed at predetermined construction points.

The overall system, shown in FIGS. 1-3, utilizes a pico projector 13 to project an image 14, including layout information, onto the ceiling or other surface of the building 11. A moveable support for supporting a worker 15 at a work position in a building under construction may comprise a scissor lift 17. The image 14 projected onto the ceiling is derived from a data base defining a Building Information Model (BIM), which incorporates building geometry, spatial relationships, and quantities, and properties of various building components. The projected image is precisely located and superimposed on the ceiling so that the worker 15 on scissor lift 17 can use the image to locate the points on the ceiling where connectors, anchors, and other devices are to be affixed and where holes are to be cut or drilled. The scissor lift 17 may be powered such that it can be driven about the construction site. In order for the image 14 to be properly positioned, oriented and sized such that the various work points defined by the image are correctly located, the two dimensional location and the orientation of the projector 14 must be accurately determined, and the image that it projects then properly sized and oriented. It will be appreciated that this will also require a determination of the distance from the projector 13 to the ceiling.

Figure 4A:
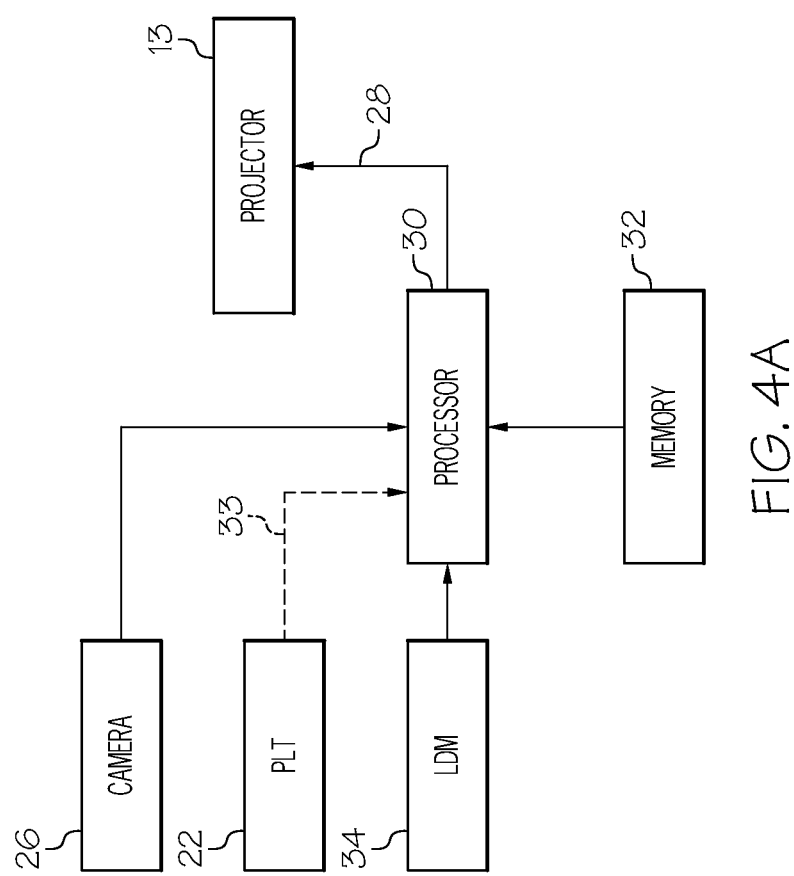
FIG. 4A is a schematic block diagram of the system used to provide a video signal to the projector in FIG. 4 on the scissor lift.

A projector, such as pico projector 13, is mounted on the railing 19 of the scissor lift 17, and projects an image 14 on a surface above the moveable support. FIGS. 4 and 4A, in conjunction with FIGS. 1, 2 and 3, illustrate an embodiment of the invention in which the position and orientation of the lift 17 and projector 13 are determined based on a determination of the distance to a PLT (portable layout tool) 22 at a known position in the room. The PLT 22 projects a laser beam 24 toward the projector 13 and, more particularly, toward a target 25. Based on the time of flight of the laser beam 24, and on the heading of the laser beam 24 from the PLT, the processor 30 determines the location of the projector 13. The system further includes video camera 26, mounted adjacent the projector 13. The video camera 26 views the PLT 22 and, based on where the PLT appears in its field of view, the processor 30 determines the orientation of the projector 13. An image signal on line 28 is provided by a processor 30, which accesses the memory 32 in which the BIM data and building plan images for the building are stored. A distance measuring system for determining the distance from the projector 13 to the surface onto which the image is projected is provided. This distance measuring system may include a laser distance measuring device 34 which determines the distance from the projector 13 to the ceiling using a beam 36. The processor 30 provides an image signal to the projector that is adjusted for the two dimensional location of the projector and for the distance from the projector 13 to the ceiling. As the operator 15 moves the scissor lift 17 about the building floor, the system keeps track of the location and orientation of the projector, altering the image projected by the projector 13 so that it accurately positions the layout information on the ceiling. The output 33 from the PLT to the processor 30 is shown as a dashed or broken line, as this may be a wireless connection between the PLT and the balance of the components carried on the lift 17. Alternatively, the PLT 22 may be wired directly to the other components.

Figure 5:
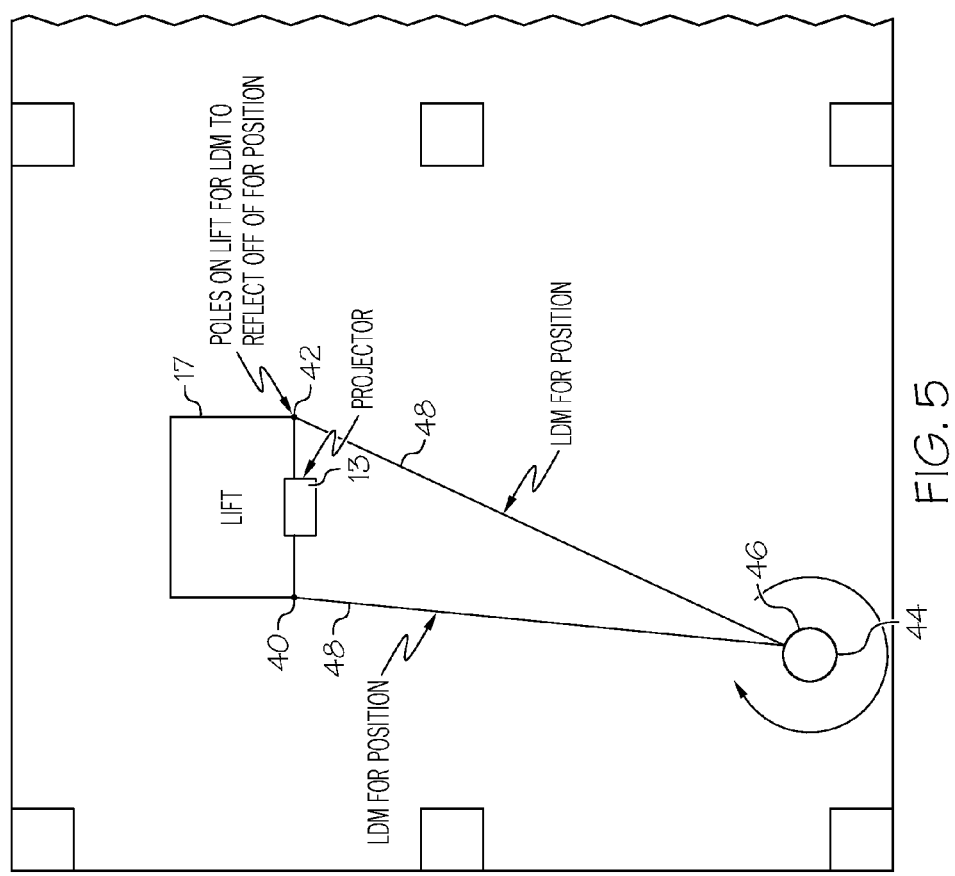
FIG. 5 is a simplified diagrammatic plan view of a lift and building floor, illustrating an embodiment in which the projector is located by a laser distance measuring device and an angle encoder at a known position in the building.

FIGS. 5 and 5A illustrate an embodiment of the invention in which the position and orientation of the lift 17 and projector 13 are determined based on an assessment of the distance and direction to target poles 40 and 42 from LDM 44. The poles 40 and 42 are vertical retroreflective poles, mounted on scissor lift 17, that reflect laser light back to the LDM 44 as the beam 48 sweeps around the room. The direction of the beam 48 is monitored by an encoder 46. The LDM 44 and encoder 46 are located at a known position in the room. The outputs from the encoder 46 and LDM 44 are supplied to the processor 30. Since the encoder 46 and the LDM 44 define the distance and direction from the LDM 44 to each of the poles 40 and 42, the location and orientation of the scissor platform 17 and projector 13 are precisely determined and are calculated by the processor 30. The image signal on line 28 is provided by processor 30 which accesses the memory 32 storing the BIM data and building plan images for the building 11. A distance measuring system determines the distance from the projector 13 to the surface onto which the image 14 is projected. This distance measuring system includes a laser distance measuring device 34 which determines the distance from the projector 13 to the ceiling. The processor 30 thus provides an image signal to the projector 13 that is adjusted for the two dimensional location of the projector, and for the distance from the projector 13 to the ceiling. As the operator 15 moves the scissor lift 17 about the building floor, the system keeps track of the location and orientation of the projector 13, altering the image 14 projected by the projector 13 so that it accurately places the layout information on the ceiling. The outputs from the LDM 44 and encoder 46 may be supplied wirelessly to processor 30, or may be provided over a wired connection.

Figure 6:
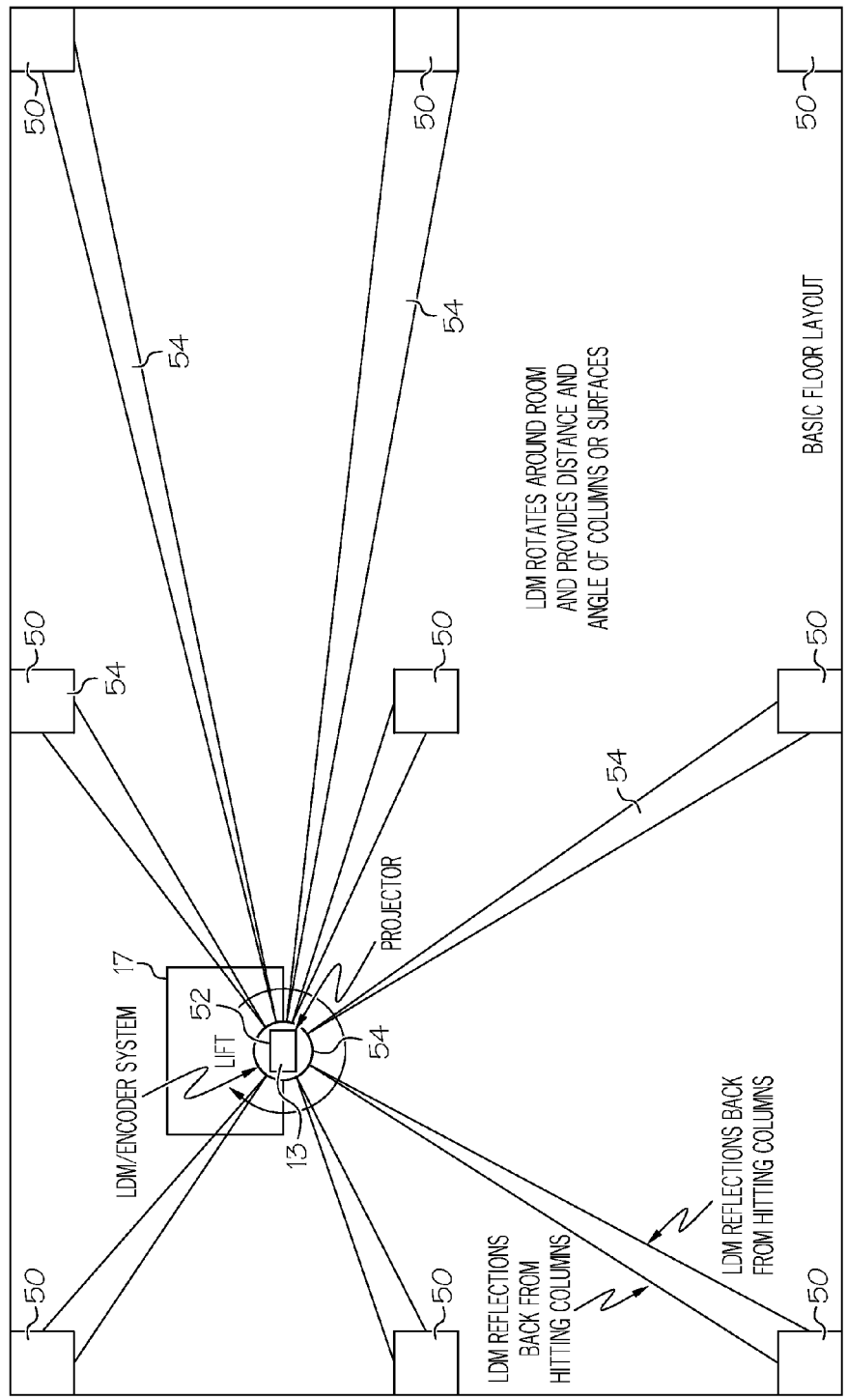
FIG. 6 is a simplified diagrammatic plan view of a lift and building floor, illustrating an embodiment in which the projector is located by a laser distance measuring device and an angle encoder on the lift.
Figure 6A:
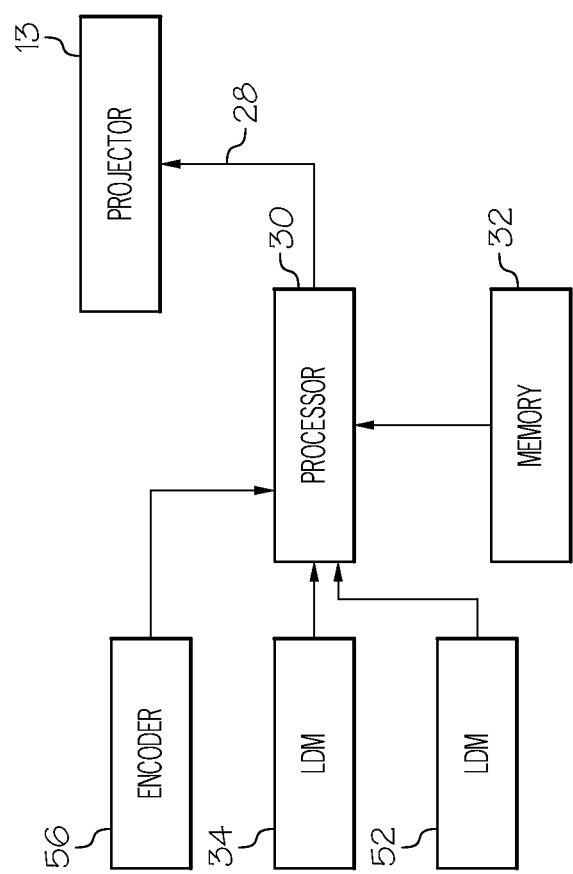
FIG. 6A is a schematic block diagram of the system used to provide a video signal to the projector in FIG. 6 on the scissor lift.

FIGS. 6 and 6A illustrate an embodiment of the invention in which the position and orientation of the lift 17 and the projector 13 are determined, based on an assessment of the distance and direction to the beams 50 that act as targets for an LDM 52. LDM 52 projects a rotating beam of laser light 54. An encoder 56 provides an indication of the direction of the beam of laser light. The beam of laser light 54 is reflected back to the LDM 52 from each of the beams 50 and, collectively, this provides an indication of the location and orientation of the projector 13 and the lift 17. The location and orientation of the scissor lift platform 17 and projector 13 are precisely determined and are calculated by the processor 30. The image signal on line 28 is then provided by the processor 30, which accesses the memory 32 in which the BIM data and building plan images for the building are stored. A distance measuring system determines the distance from the projector 13 to the surface onto which the image 14 is projected. This distance measuring system may include a laser distance measuring device 34 which determines the distance from the projector 13 to the ceiling. The processor 30 thus provides an image signal to the projector 13 that is adjusted for the two dimensional location of the projector and for the distance from the projector 13 to the ceiling. As the operator 15 moves the scissor lift 17 about the building floor, the system keeps track of the location and orientation of the projector 13, altering the image projected by the projector 13 so that it accurately positions the image of the layout information on the ceiling.

Figure 7:
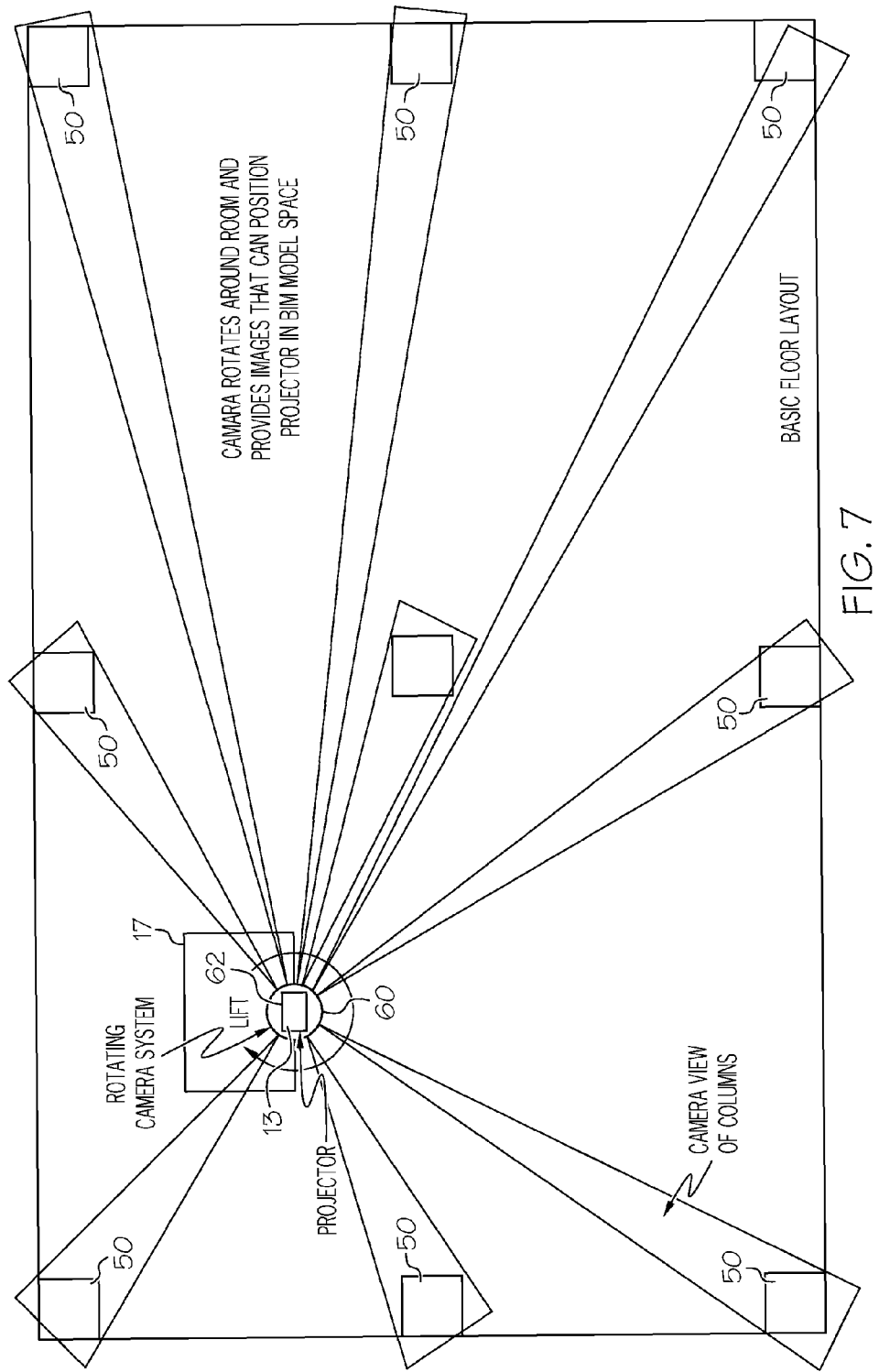
FIG. 7 is a simplified diagrammatic plan view of a lift and building floor, illustrating an embodiment in which the projector is located by a rotating video camera and an angle encoder on the lift.
Figure 7A:
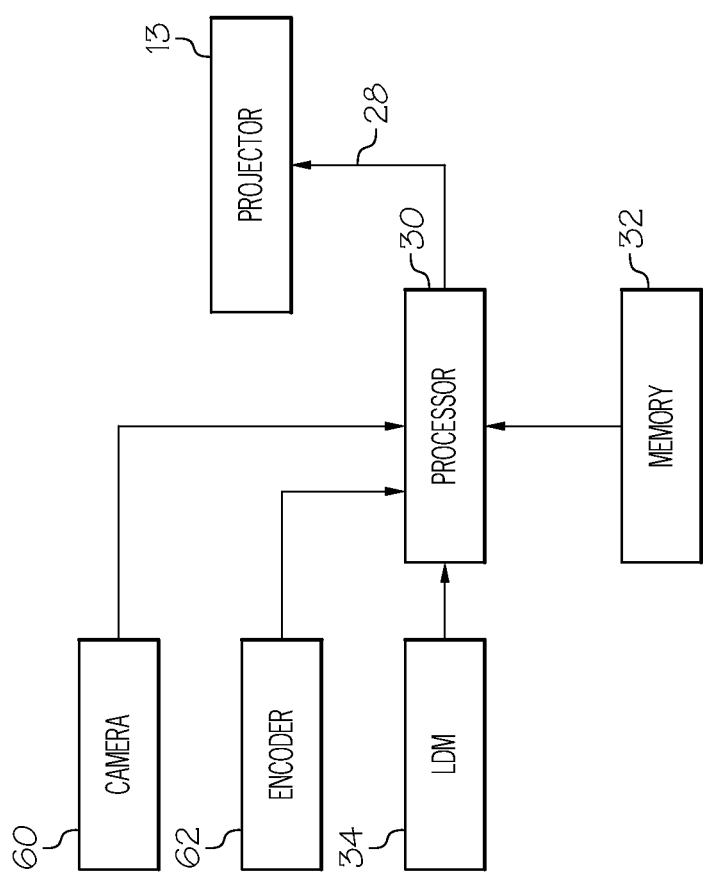
FIG. 7A is a schematic block diagram of the system used to provide a video signal to the projector in FIG. 7 on the scissor lift.

FIGS. 7 and 7A illustrate an embodiment of the invention in which the position and orientation of the lift 17 and projector 13 are determined based on an assessment of the direction to the beams 50. Beams 50 are positioned at known locations and act as targets for a camera 60 that rotates and an encoder 62 that keeps track of the direction of the camera's field of view. The camera 60 and the encoder 62 are carried on the lift 17 along with the projector 13. The location and orientation of the scissor platform 17 and projector 13 are precisely determined by the processor 30. The image signal on line 28 is provided by the processor 30, which accesses the memory 32 in which the BIM data and building plan images for the building 11 are stored. A distance measuring system for determining the distance from the projector 13 to the surface onto which the image is projected is provided. This distance measuring system may include a laser distance measuring device 34 which determines the distance from the projector 13 to the ceiling. The processor 30 thus provides an image signal to the projector 13 that is adjusted for the two dimensional location of the projector and for the distance from the projector 13 to the ceiling. As the operator 15 moves the scissor lift 17 about the building floor, the system keeps track of the location and orientation of the projector 13, altering the image projected by the projector 13 so that it accurately positions the image of the layout information on the ceiling.

Figure 8:
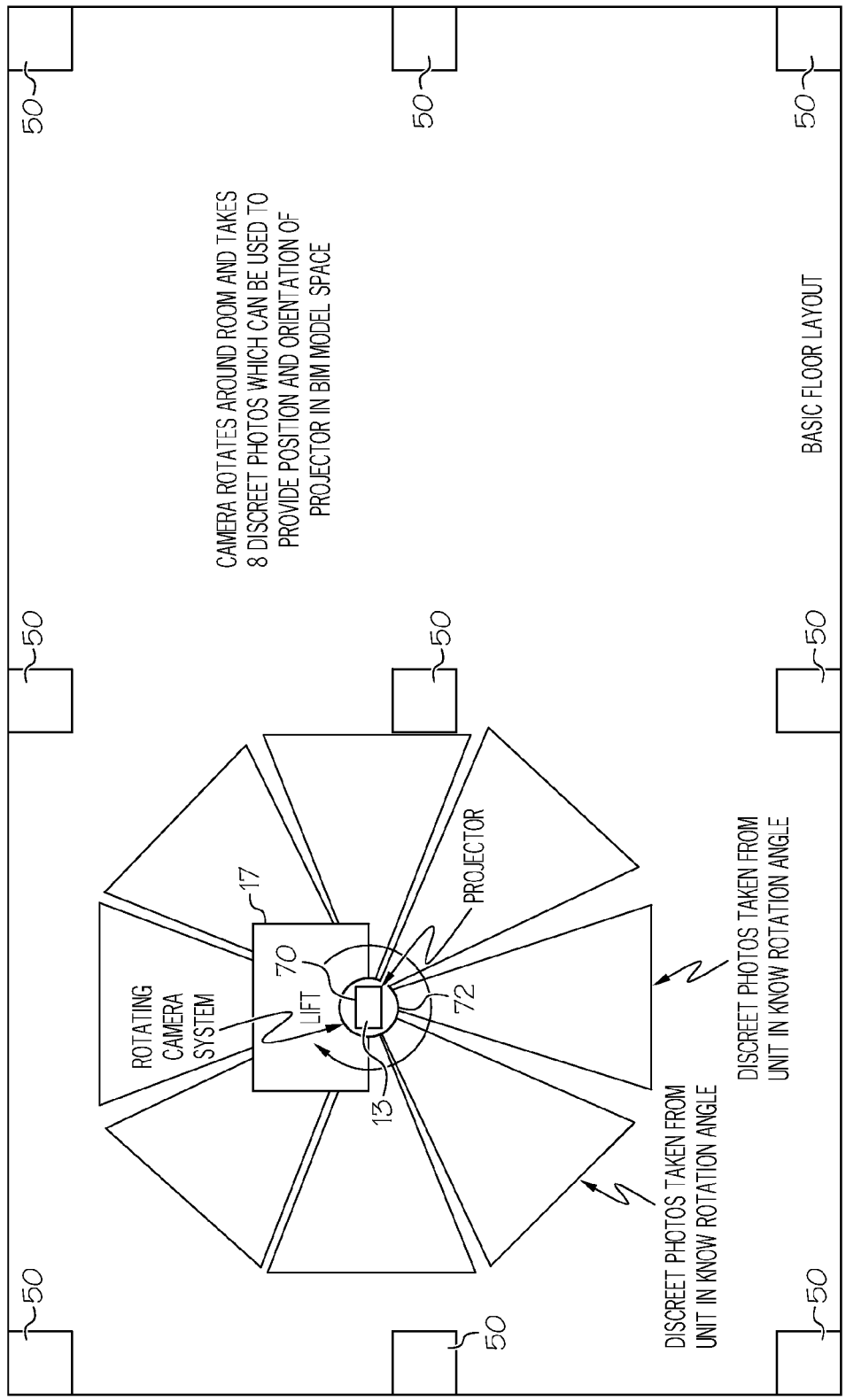
FIG. 8 is a simplified diagrammatic plan view of a lift and building floor, illustrating an embodiment in which the projector is located by a video camera and an angle encoder on the lift, in which the video camera takes eight discrete photographs.
Figure 8A:
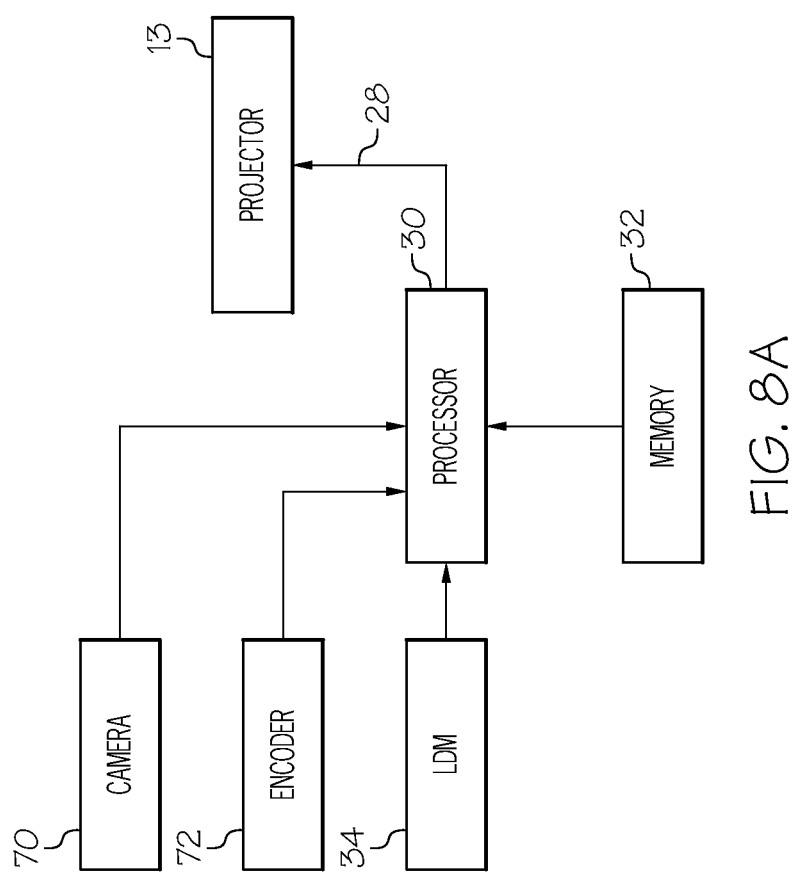
FIG. 8A is a schematic block diagram of the system used to provide a video signal to the projector in FIG. 8 on the scissor lift.

FIGS. 8 and 8A illustrate an embodiment of the invention in which the position and orientation of the lift 17 and projector 13 are determined based on an assessment of the detected direction to the beams 50, or to other features of the room, from a rotating camera 70. Camera 70 is rotated to eight positions, each spaced by 45 degrees from adjacent positions, such that a panoramic image of the room is effectively developed. The heading of each of these images is insured by reference to encoder 72 that provides an output indicative of the field of view of the camera 70. By determining the heading to multiple beams or other features of known location in the room, the position and orientation of the lift 17 and the projector 13 may be determined. Based on this information and on the output from LDM 34, which measures the distance from the projector 13 to the ceiling, the projector 13 receives an image signal on line 28 which is adjusted such that the image projected onto the ceiling includes properly positioned layout information for use by a worker standing on the platform of the lift 17. The image signal on line 28 is provided by the processor 30, which accesses the memory 32, in which the BIM data and building plan images for the building are stored. As the operator 15 moves the scissor lift 17 about the building floor, the system keeps track of the location and orientation of the projector 13, altering the image projected by the projector 13 so that it accurately positions the image of the layout information on the ceiling.

Figure 9B:
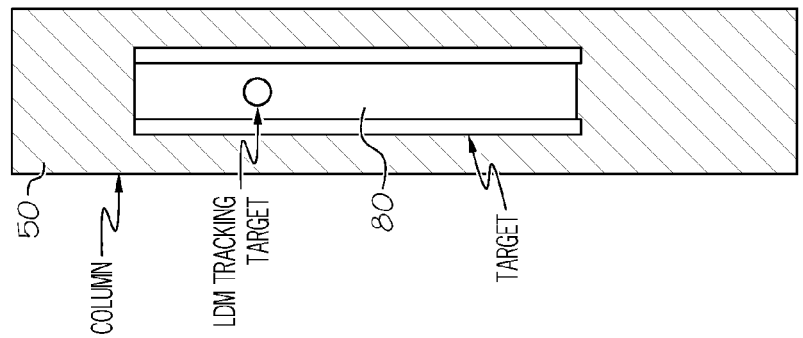
FIG. 9B is a simplified diagrammatic view of a portion of a building column and a laser distance measuring target mounted thereon, for the laser distance measuring device of FIG. 9A.
Figure 9A:
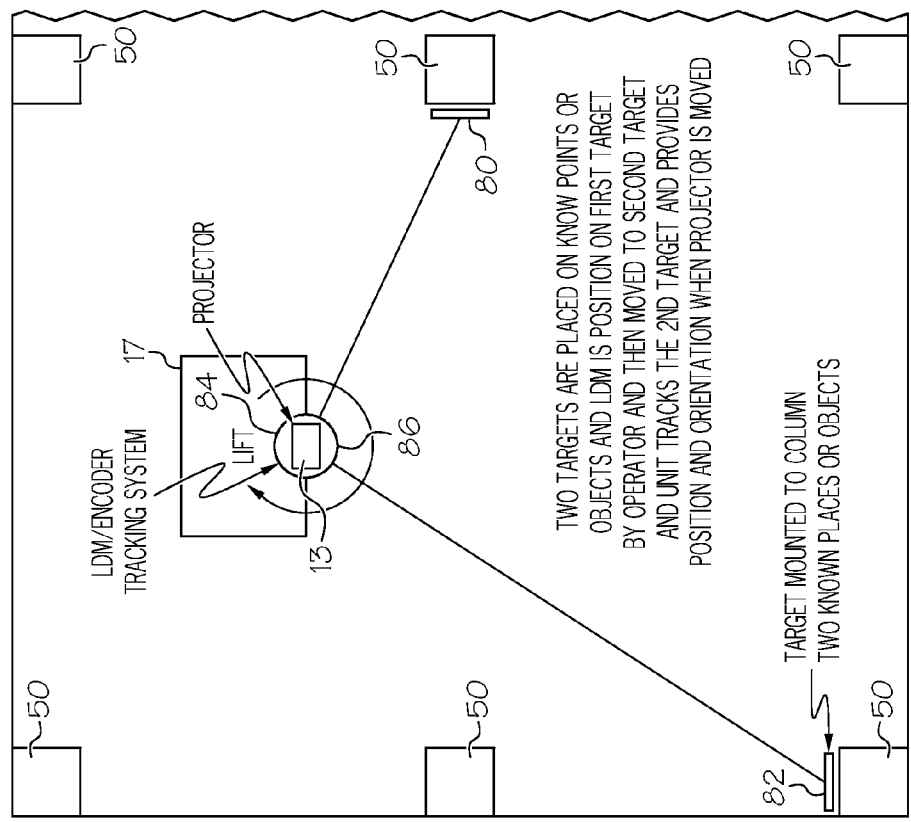
FIG. 9A is a simplified diagrammatic plan view of a lift and building floor, illustrating an embodiment in which the projector is located by a laser distance measuring device and an angle encoder on the lift, tracking targets at known locations.
Figure 9C:
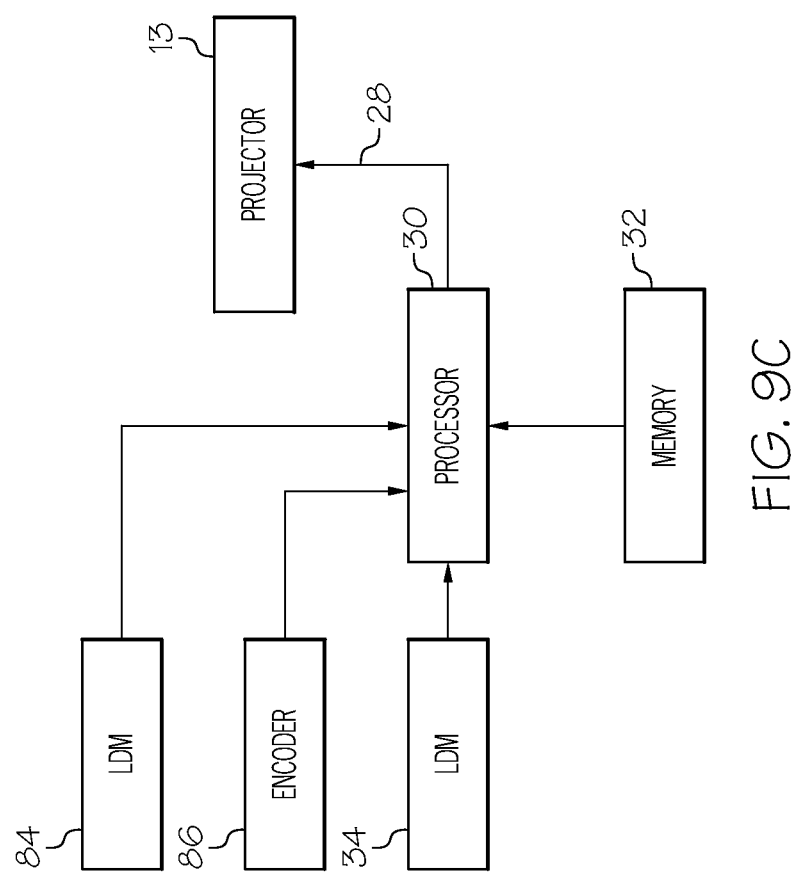
FIG. 9C is a schematic block diagram of the system used to provide a video signal to the projector in FIG. 9A on the scissor lift.

FIGS. 9A, 9B, and 9C illustrate an embodiment of the invention in which the position and orientation of the lift 17 and projector 13 are determined based on an assessment of the distance and direction to the targets 80 and 82. LDM 84 directs a rotating beam of laser light outward and sweeps the beam around the room, causing it to sweep across targets 80 and 82. The encoder 86 keeps track of the direction in which the beam is oriented when it strikes each of the targets 80 and 82. The targets are at known locations. The beam of laser light is reflected back to the LDM 84 from each of the targets and collectively this provides an indication of the location and orientation of the projector 13 and the lift 17. The location and orientation of the scissor lift 17 and projector 13 are precisely determined and are calculated by the processor 30. The image signal on line 28 is provided by the processor 30, which accesses the memory 32 in which the BIM data and building plan images for the building are stored. A distance measuring system for determining the distance from the projector 13 to the surface onto which the image is projected may include a laser distance measuring device 34. The processor 30 thus provides an image signal to the projector 13 that is adjusted for the two dimensional location of the projector and for the distance from the projector 13 to the ceiling. As the operator 15 moves the scissor lift 17 about the building floor, the system keeps track of the location and orientation of the projector 13, altering the image projected by the projector 13 so that it accurately positions the image of the layout information on the ceiling.

Figure 10C:
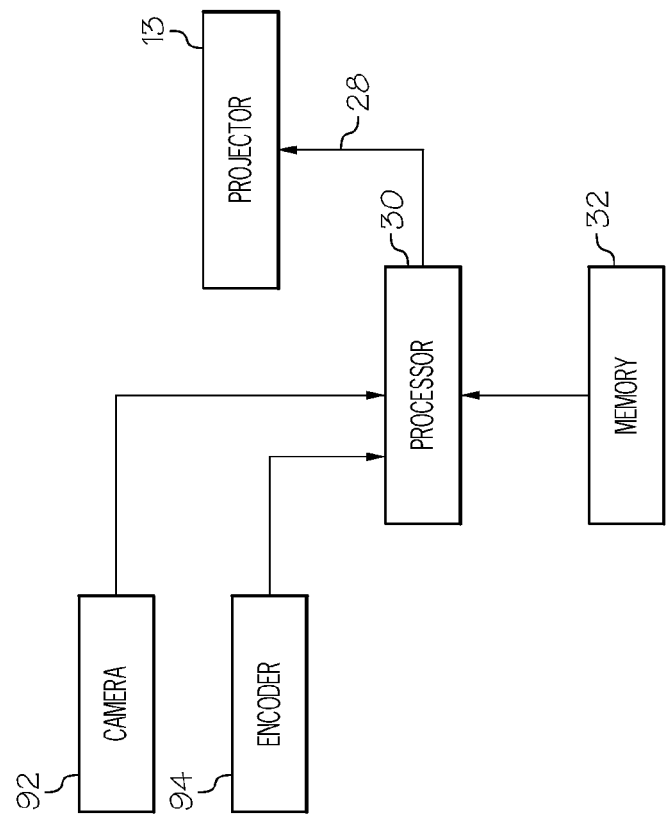
FIG. 10C is a schematic block diagram of the system used to provide a video signal to the projector in FIG. 10A on the scissor lift.
Figure 10B:
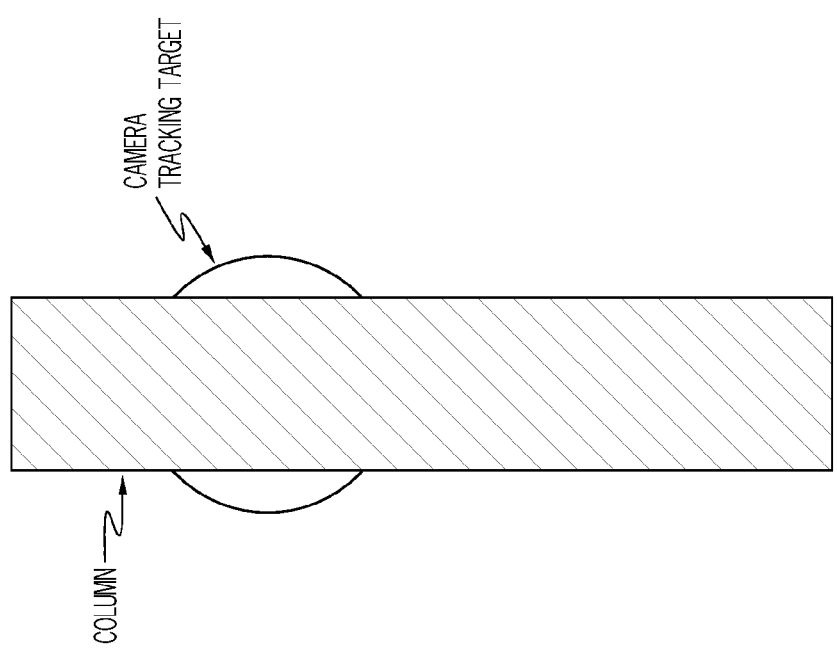
FIG. 10B is a simplified diagrammatic view of a portion of a building column, illustrating how it acts as a tracking target for the video camera of FIG. 10A.

FIGS. 10A, 10B, and 10C illustrate an embodiment of the invention in which the position and orientation of the lift 17 and projector 13 are determined based on an assessment of the direction to two or more of the beams 50 that act as targets. The video camera 92 on the lift 17 is rotated to sweep the room and an encoder 94 determines the direction of its field of view when it sees a beam 50. The direction of the two or more beams of known location on the floor permits the processor 30 to determine the position and orientation of the projector 13. The image signal on line 28 is provided by the processor 30, which accesses the memory 32 in which the BIM data and building plan images for the building are stored. A distance measuring system for determining the distance from the projector 13 to the surface onto which the image is projected is provided. This distance measuring system may include a laser distance measuring device 34 which determines the distance from the projector 13 to the ceiling. The processor 30 thus provides an image signal to the projector 13 that is adjusted for the two dimensional location of the projector and for the distance from the projector 13 to the ceiling. As the operator 15 moves the scissor lift 17 about the building floor, the system keeps track of the location and orientation of the projector 13, altering the image projected by the projector 13 so that it accurately positions the image of the layout information on the ceiling.

Figure 11A:
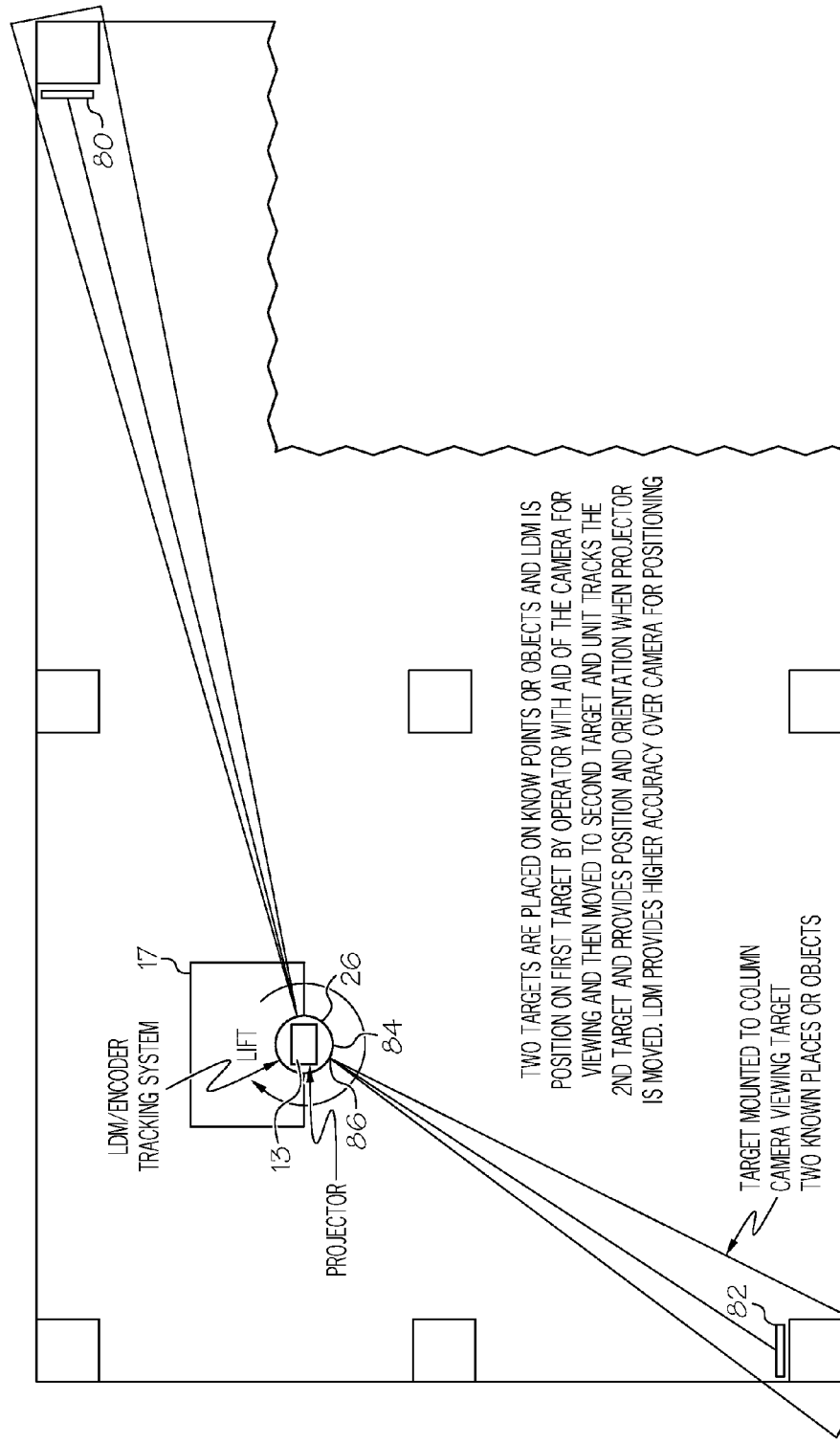
FIG. 11A is a simplified diagrammatic plan view of a lift and building floor, illustrating an embodiment in which the projector is located by a laser distance measuring device, a video camera, and an angle encoder on the lift, with both the video camera and the laser distance measuring device tracking targets at known locations.
Figure 11C:
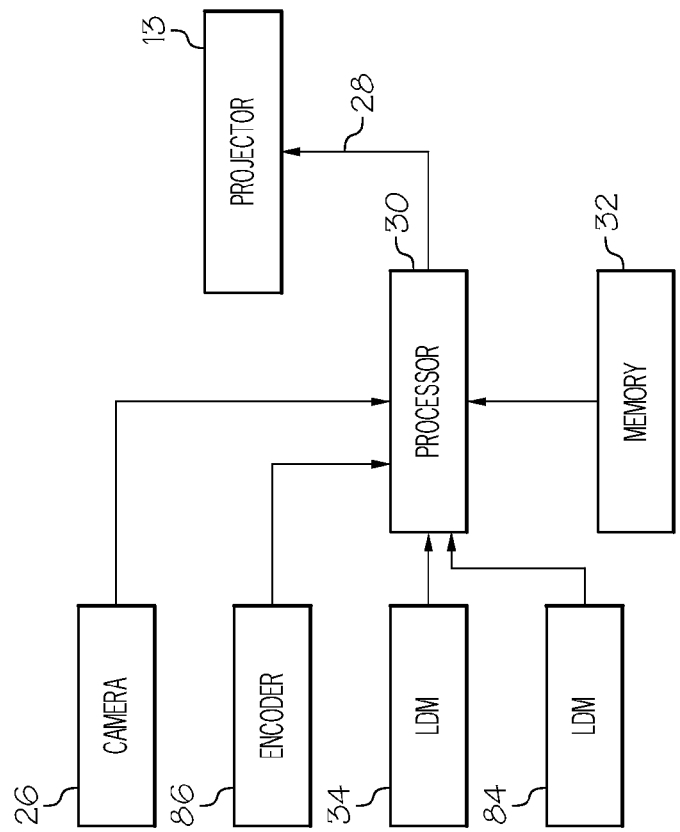
FIG. 11C is a schematic block diagram of the system used to provide a video signal to the projector in FIG. 11A on the scissor lift.
Figure 11B:
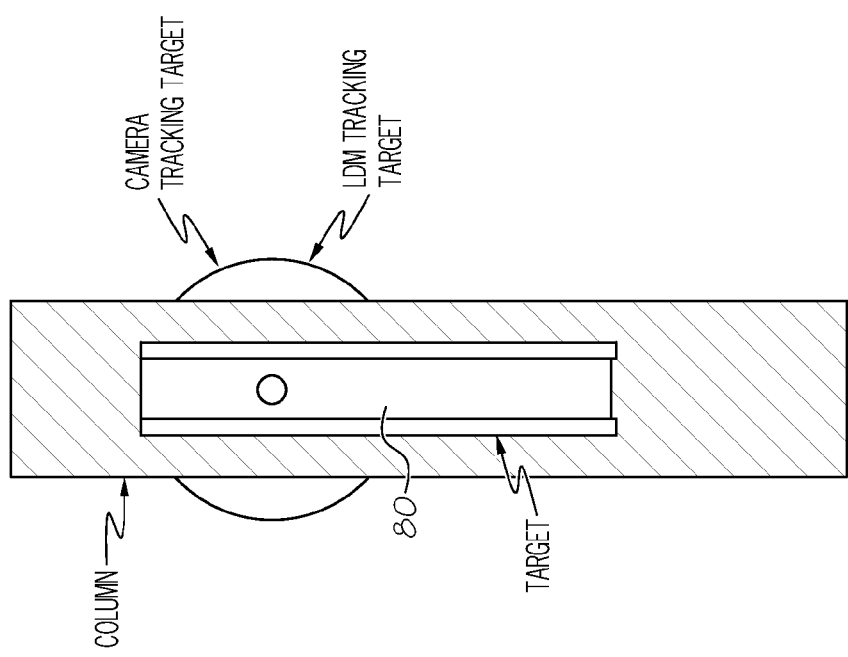
FIG. 11B is a simplified diagrammatic view of a portion of a building column, and a laser distance measuring target mounted on the column, illustrating how the target acts as a tracking target for the laser distance measuring device and the video camera of FIG. 11A.

The embodiment of FIGS. 11A, 11B, and 11C determines the position and orientation of the lift 17 and projector 13 in the same manner as explained above in respect to the embodiment of FIGS. 9A, 9B, and 9C, determining the direction of two targets 80 and 82 on two beams of known position, using an LDM 84 that rotates a beam of laser light around the room. Light reflected from the targets and the output of the encoder 86 provide an indication of the direction of the targets and the distance from the targets to the LDM 84, as well. Additionally, a camera 26 sweeps its field of view around the room and locates the beams 50 and targets 80 and 82 in synchronization with the movement of the beam. The position and orientation of the projector 13 and the lift 17 are determined by the processor 30. The image signal on line 28 is provided by the processor 30, which accesses the memory 32 in which the BIM data and building plan images for the building are stored. A distance measuring system for determining the distance from the projector 13 to the surface onto which the image is projected is provided. This distance measuring system may include a laser distance measuring device 34 which determines the distance from the projector 13 to the ceiling. The processor 30 thus provides an image signal to the projector 13 that is adjusted for the two dimensional location of the projector and for the distance from the projector 13 to the ceiling. As the operator moves the scissor lift 17 about the building floor, the system keeps track of the location and orientation of the projector 13, altering the image projected by the projector 13 so that it accurately positions the image of the layout information on the ceiling.

Figure 12C:
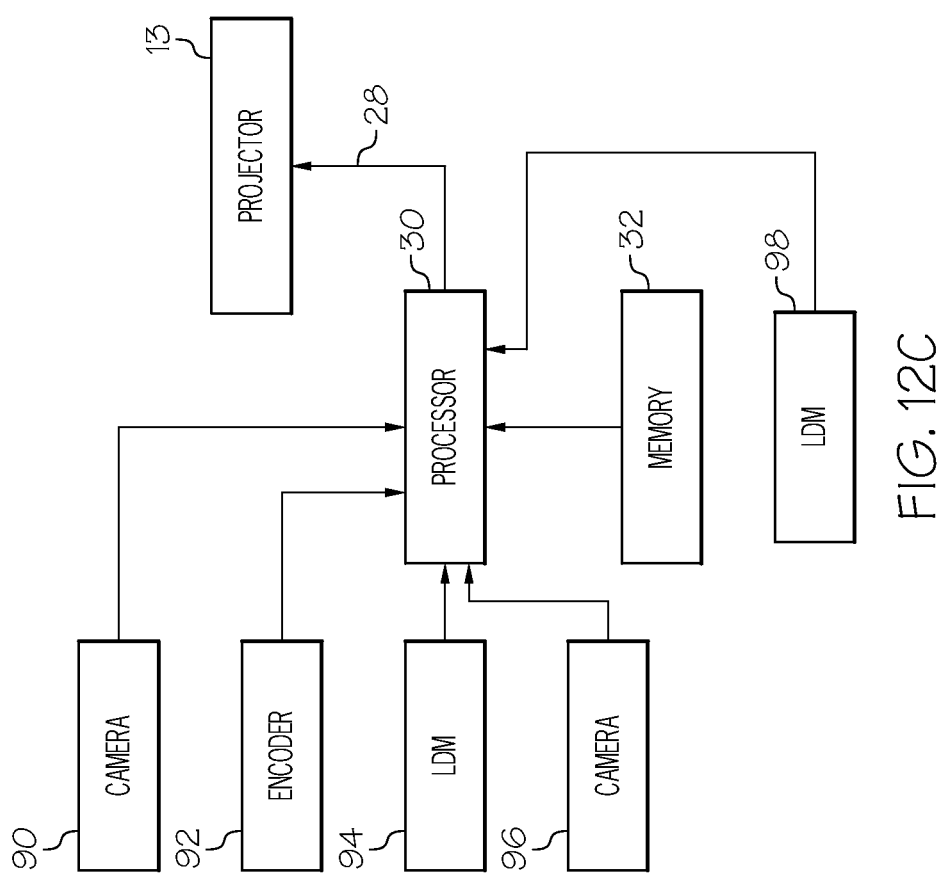
FIG. 12C is a schematic block diagram of the system used to provide a video signal to the projector in FIG. 12A on the scissor lift.

The embodiment of FIGS. 12A, 12B, and 12C determines the position and orientation of the lift 17 and projector 13 in the same manner as explained above in respect to the embodiment of FIGS. 9A, 9B, and 9C, determining the direction of two targets 88 and 89 on two beams of known position, using an LDM 94 that rotates a beam of laser light around the room. Light reflected from the targets and the output of the encoder 92 provide an indication of the direction of the targets and the distance from the targets to the LDM 94, as well. Additionally, a pair of cameras 90 and 96 are locked onto the targets 88 and 89, respectively, and monitor the relative position of lift 17 as it moves about the building. The position and orientation of the projector 13 and the lift 17 are determined by the processor 30. The image signal on line 28 is provided by the processor 30, which accesses the memory 32 in which the BIM data and building plan images for the building are stored. A distance measuring system for determining the distance from the projector 13 to the surface onto which the image is projected is provided. This distance measuring system may include a laser distance measuring device 98 which determines the distance from the projector 13 to the ceiling. The processor 30 thus provides an image signal to the projector 13 that is adjusted for the two dimensional location of the projector and for the distance from the projector 13 to the ceiling. As the operator moves the scissor lift 17 about the building floor, the two cameras provide continuing location and orientation information, allowing the image projected by the projector 13 to be altered so that it accurately positions the image of the layout information on the ceiling.

Figure 13:
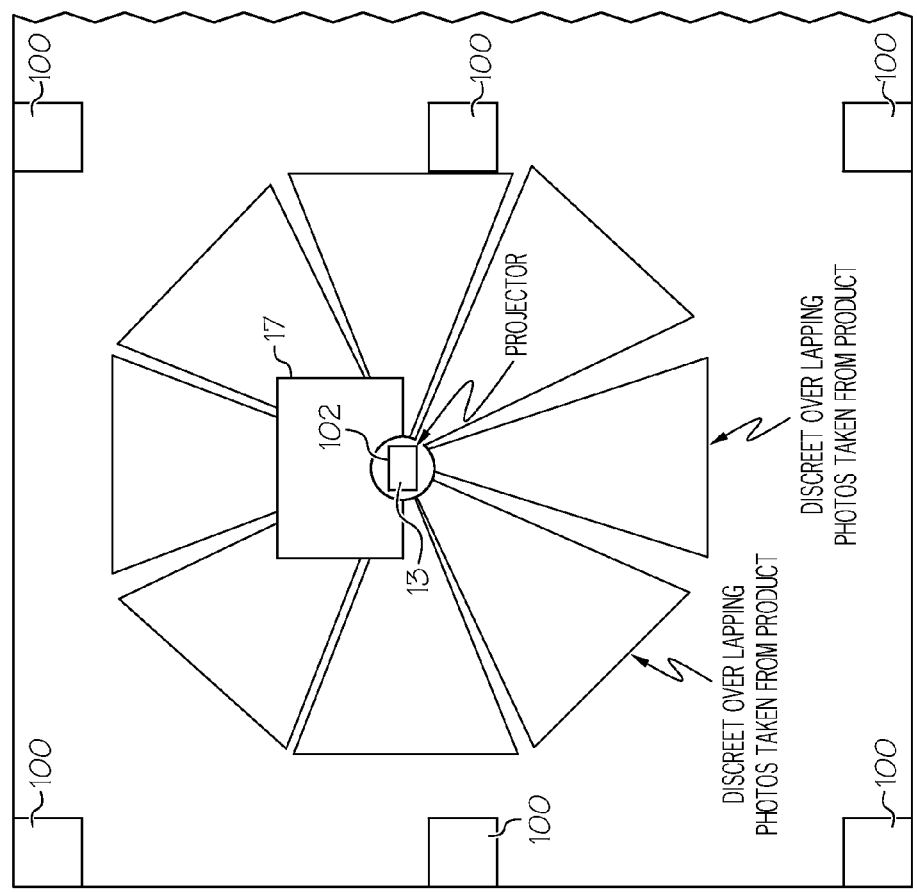
FIG. 13 is a simplified diagrammatic view of a lift and building floor, illustrating an embodiment in which the projector is located by a plurality of video cameras.
Figure 13A:
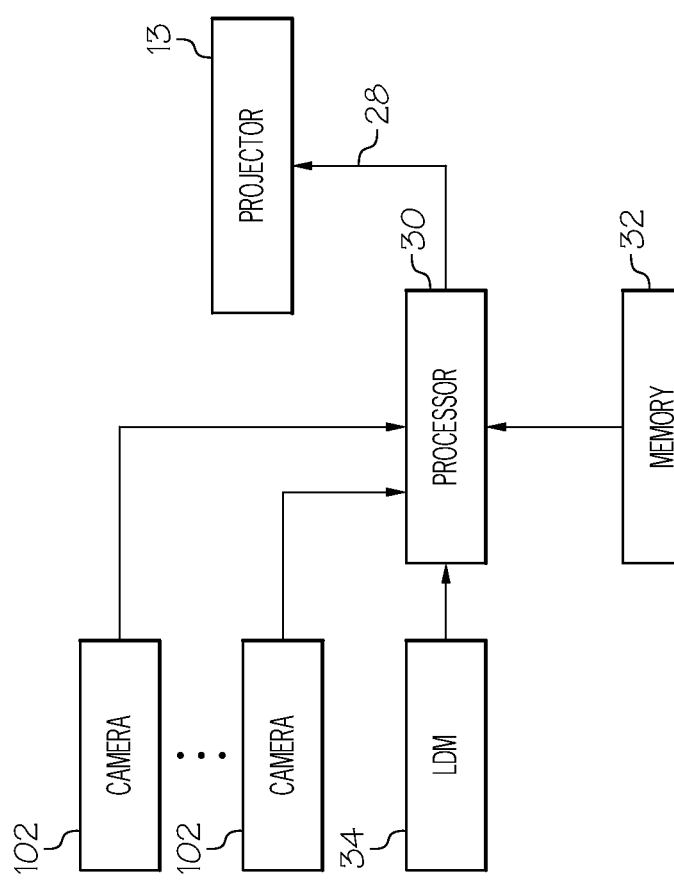
FIG. 13A is a schematic block diagram of the system used to provide a video signal to the projector in FIG. 13.

Finally, the embodiment of FIG. 13 and FIG. 13A determines the position and orientation of the lift 17 and projector 13 based on an assessment of the detected direction to the beams 100, or to other features of the room, from eight cameras 102 which face in eight, evenly spaced directions, each forty five degrees from adjacent cameras. By this arrangement, essentially a panoramic view of the building is produced. By determining the heading to multiple beams or other features of known location in the room, the position and orientation of the lift 17 and the projector 13 may be determined. Based on this information and on the output from an LDM 34, which measures the distance from the projector 13 to the ceiling, the projector 13 receives an image signal on line 28 which is adjusted such that the image projected onto the ceiling includes properly positioned layout information for use by a worker standing on the platform of the lift 17. The image signal on line 28 is provided by the processor 30, which accesses the memory 32, in which the BIM data and building plan images for the building are stored. As the operator 15 moves the scissor lift 17 about the building floor, the system keeps track of the location and orientation of the projector 13, altering the image projected by the projector 13 so that it accurately positions the image of the layout information on the ceiling. It will be appreciated that, if desired, the eight cameras 102 may be replaced by a single camera having a 360 degree field of view.

As will be apparent, the embodiments disclosed above permit a worker to perform construction operations with little layout work on a ceiling surface, or other surface if the projector were to be oriented for projection on a wall. A worker positions a moveable support at a work position, providing a projector on the moveable support. The system determines the distance from the projector to the surface upon which the layout information image is to be projected so that the image can be focused and also properly sized. The image is then projected onto the ceiling or other surface such that the worker can use tools to work at locations defined by the image. The location and orientation of the projector in the building is determined so that the appropriate image can be projected.

An image may be projected onto a wall or a floor by appropriately reorienting and positioning the projector. Alternatively, the image may be directed onto a wall or floor surface without changing the upward-facing orientation of the surface by interposing a mirror or prism optical arrangement between the projector and the wall or floor surface. In the event that an image reversal results from the reflection of the projected image by the mirror or prism optical arrangement, the original image projected by the projector may be reversed so that a proper image is projected onto the surface.

Figure 14:
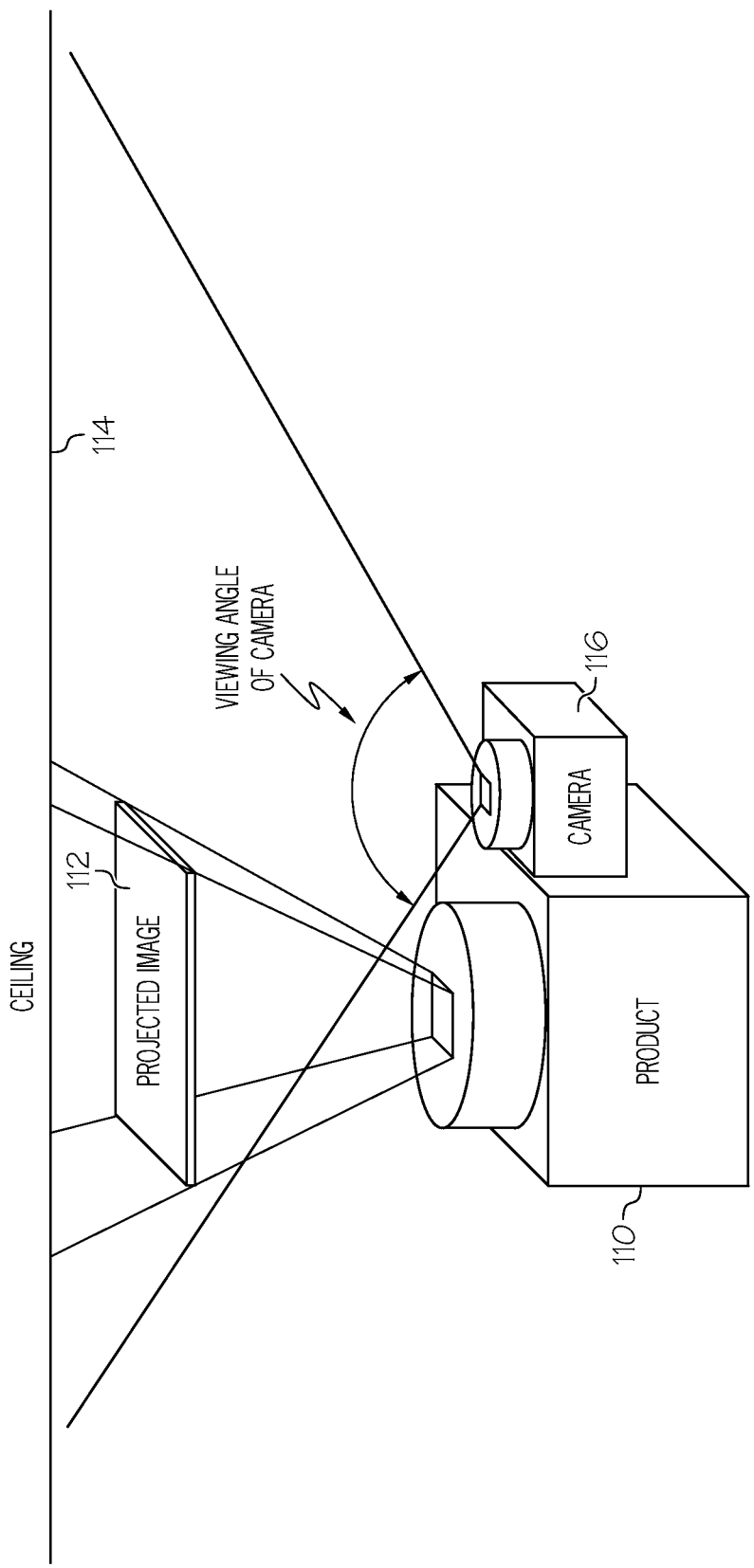
FIG. 14 is a simplified diagrammatic view showing a pico projector and associated camera.

Reference is made to FIG. 14 which shows diagrammatically a pico projector 110 that projects an image 112 onto a surface, such as ceiling 114. Associated with the projector 110 is a video camera 116 which has a field of view that exceeds the size of the image 112 as projected onto surface 114. The processor of the system that provides the video signal to projector 110 uses the output from the camera 116 to compensate for any vibration of the projector 110 and shaking of the projected image 112. It will be appreciated that the camera 116 is associated with the projector 110 in the sense that the two elements are joined together mechanically. Any movement of the ceiling 114 sensed by the camera 116 is an indication of movement of the camera 110. As a consequence, the image 112 is caused to vibrate in the right direction, frequency and amplitude to offset the movement of the image 112 that would otherwise result from the camera 110 vibrating. It will also be appreciated that the camera 116 can be used to record video images of the surface 114, showing the "as-built" arrangement of construction points on the surface and, if desired, the projected image 112. This will highlight significant discrepancies in the actual construction point locations.

Reference is made to FIG. 15 which shows the projector 110 projecting image 112 toward ceiling 114. If required, the image 112 may be shifted laterally by inserting an appropriate optical element 120, shown as an optical wedge, in the projection path. If the optical element 120 induces image distortion, this can be offset by the appropriate distortion of the image before it is shifted by the element 120.

It will be appreciate that in addition to projecting an image on a building surface that indicates the location of construction features associated with that particular surface, the system may project an image that includes a wide variety of additional information. The image may include representations of various items that will be located on the surface, as well as information such as hole size and depth, torque to be applied to a piece of hardware, and the like. Further, additional information may be projected onto the surface, such as navigation of movement instructions.

It will also be appreciated that the projector system may be used without a scissor lift. The projector will find particular utility apart from a lift if the image is to be projected on a surface, such as a wall, where workers may access much of the surface unaided by a lift. The projector may also be positioned on a number of other appropriate objects, such as for example a tripod, a cart, a ladder, a boom lift or the like, whether powered or manually moveable.

It will also be appreciated that the projector system may be used with three laser distance measuring devices. By using three such devices, the coordinates of three points on the surface upon which the image is to be projected may be determined. Assuming that the surface is planar, its orientation is precisely defined by the three points. This permits the projector to be properly positioned so that the image is projected normal to the surface, or the image to be distorted to compensate for projection at an oblique angle.

If desired, the image projected onto a building surface, such as a wall or ceiling, may include a graphic representation of a part that will be installed there, such as a wall switch or ceiling fan. Further, installation and warning instructions may also be provided as a part of the projected image to assist the worker installing the part.

What is claimed is:

1. A system for projecting an image including layout information on a surface in a building under construction, comprising:
   a moveable support for supporting a worker at a work position in the building under construction,
   a projector, mounted on the moveable support, for projecting the image on the surface above the moveable support in response to an image signal defining the image to be projected, said image indicating the location of connectors, anchors, and holes to be affixed to, or cut through, said surface,
   the system for determining the two dimensional position and orientation of the projector in the building, wherein said building has a plurality of recognizable features at known positions, and wherein said system for determining the two dimensional position and orientation of the projector in the building comprises a rotating laser distance measuring system on said moveable support for projecting a rotating beam of laser light which sweeps across said features at known positions in said building and determines the distance and heading of said features from said moveable support,
   a distance measuring system for determining the distance from said projector to said surface,
   a memory in which is stored building plan images for the building, and
   a processor, responsive to said memory, to said distance measuring system, and to said system for determining the two dimensional position of the projector, for providing the image signal to said projector adjusted for the two dimensional position of said projector and for the distance from said projector to said surface.

2. The system for projecting an image including layout information on a surface in a building under construction according to claim 1, in which said distance measuring system includes an electronic distance measuring system.

3. The system for projecting an image including layout information on a surface in a building under construction according to claim 1, in which said system for determining the two dimensional position and orientation of the projector in the building comprises plurality of target reflectors positioned at known locations about the building.

4. A system for projecting an image including layout information on a surface in a building under construction, comprising:
   a moveable support for supporting a worker at a work position in a building under construction,
   a projector, mounted on the moveable support, for projecting an image on a surface above the moveable support in response to an image signal defining the image to be projected, said image indicating the location of connectors, anchors, and holes to be affixed to or cut through said surface,
   a distance measuring system for determining the distance from said projector to said surface,
   a memory having stored therein the building plan images for the building, and
   a processor, responsive to said memory and to said distance measuring system, for determining the two dimensional position and orientation of the projector based on input from a rotating laser distance measuring system that projects a rotating beam of laser light which sweeps across recognizable features at known positions in said building and determines the distance and heading of said features from said moveable support, and for providing an image signal to said projector adjusted for the two dimensional position of said projector and for the distance from said projector to said surface.

5. The system for projecting an image including layout information on a surface in a building under construction according to claim 4, comprising:
   a manual input for inputting the two dimensional location and orientation of said moveable support.

6. The system for projecting an image including layout information on a surface in a building under construction according to claim 4, in which said projector, mounted on the moveable support, comprises a pico projector for projecting an image on a ceiling above the moveable support, said image indicating the location of connectors, anchors, and holes to be affixed to or cut through said surface.

7. The system for projecting an image including layout information on a surface in a building under construction according to claim 4, in which said distance measuring system for determining the distance from said projector to said surface comprises a laser distance measuring system.

8. The system for projecting an image including layout information on a surface in a building under construction according to claim 7, in which said distance measuring system determines the distance to a plurality of points spaced about a ceiling surface, and in which said processor adjusts the image projected by said projector to compensate for an inclination of said ceiling surface.

9. A system for projecting an image including layout information on a surface in a building under construction, comprising:
   a projector for projecting an image on a surface in the building in response to an image signal defining the image to be projected, said image indicating the location of construction features on said surface,
   a system for determining the two dimensional position and orientation of the projector in the building, wherein said building has a plurality of recognizable features at known positions, and wherein said system for determining the two dimensional position and orientation of the projector in the building comprises a rotating laser distance measuring system associated with said projector and configured for projecting a rotating beam of laser light which sweeps across said features at known positions in said building and determines the distance and heading of said features from a moveable support,
   a distance measuring system for determining the distance from said projector to said surface,
   a memory in which is stored building plan images for the building, and
   a processor, responsive to said memory, to said distance measuring system, and to said system for determining the two dimensional position and orientation of the projector, for providing an image signal to said projector adjusted for the two dimensional position of said projector and for the distance from said projector to said surface.

10. The system for projecting an image including layout information on a surface in a building under construction according to claim 9, in which said distance measuring system includes an electronic distance measuring system.

11. The system for projecting an image including layout information on a surface in a building under construction according to claim 9, in which said system for determining the two dimensional position and orientation of the projector in the building comprises plurality of target reflectors positioned at known locations about the building.

12. A system for projecting an image including layout information on a surface in a building under construction, comprising:
   a projector for projecting an image on a surface in the building in response to an image signal defining the image to be projected, said image indicating the location of construction features on said surface,
   a distance measuring system for determining the distance from said projector to said surface,
   a memory having stored therein the building plan images for the building, and
   a processor, responsive to said memory and to said distance measuring system, for determining the two dimensional position and orientation of the projector based on input from a rotating laser distance measuring system that projects a rotating beam of laser light which sweeps across recognizable features at known positions in said building and determines the distance and heading of said features from a moveable support, and for providing an image signal to said projector adjusted for the two dimensional position of said projector and for the distance from said projector to said surface.

13. The system for projecting an image including layout information on a surface in a building under construction according to claim 12, comprising:
   a manual input for inputting the two dimensional position and orientation of said projector.

14. The system for projecting an image including layout information on a surface in a building under construction according to claim 12, in which said projector comprises a pico projector for projecting an image on a building surface.

15. The system for projecting an image including layout information on a surface in a building under construction according to claim 12, in which said distance measuring system for determining the distance from said projector to said surface comprises a laser.

16. The system for projecting an image including layout information on a surface in a building under construction according to claim 15, in which said distance measuring system determines the distance to a plurality of points spaced about building surface, and in which said processor adjusts the image projected by said projector to compensate for the orientation of said building surface.

* * * * *